US008288894B2

(12) United States Patent  
Yoshimura

(10) Patent No.: US 8,288,894 B2
(45) Date of Patent: Oct. 16, 2012

(54) POWER ELECTRONICS EQUIPMENT FOR TRANSMITTING SIGNALS TO SWITCHING DEVICES THROUGH AIR-CORED INSULATING TRANSFORMER

(75) Inventor: Hiroyuki Yoshimura, Yokohama (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 1652 days.

(21) Appl. No.: 11/703,801

(22) Filed: Feb. 8, 2007

(65) Prior Publication Data

US 2007/0216377 A1    Sep. 20, 2007

(30) Foreign Application Priority Data

Mar. 16, 2006    (JP) .................................. 2006-073165

(51) Int. Cl.
    *H01F 27/28*    (2006.01)
(52) U.S. Cl. ....................................................... 307/104
(58) Field of Classification Search .................... 307/104
    See application file for complete search history.

(56) References Cited

U.S. PATENT DOCUMENTS

| 4,554,512 | A | * | 11/1985 | Aiello | 330/10 |
| 5,533,054 | A | | 7/1996 | DeAndrea et al. | |
| 5,701,037 | A | | 12/1997 | Weber et al. | |
| 6,677,764 | B1 | * | 1/2004 | Bachman | 324/658 |
| 7,622,887 | B2 | * | 11/2009 | Yoshimura | 318/810 |
| 7,994,890 | B2 | * | 8/2011 | Edo et al. | 336/200 |
| 2003/0218892 | A1 | * | 11/2003 | Nakagawa | 363/56.12 |
| 2004/0108929 | A1 | * | 6/2004 | Ichikawa et al. | 336/83 |
| 2005/0243582 | A1 | * | 11/2005 | Lee et al. | 363/50 |
| 2007/0205748 | A1 | * | 9/2007 | Abou | 324/100 |
| 2007/0218595 | A1 | * | 9/2007 | Yoshimura | 438/138 |
| 2008/0266042 | A1 | * | 10/2008 | Yoshimura et al. | 336/181 |
| 2009/0046489 | A1 | * | 2/2009 | Yoshimura et al. | 363/123 |
| 2009/0052214 | A1 | * | 2/2009 | Edo et al. | 363/123 |
| 2009/0256687 | A1 | * | 10/2009 | French et al. | 340/310.17 |

FOREIGN PATENT DOCUMENTS

| EP | 0 282 102 | 9/1988 |
| EP | 0 307 345 | 3/1989 |
| FR | 2 679 670 | 1/1993 |
| JP | U-H2-4217 | 1/1990 |
| JP | H04-185396 | 7/1992 |
| JP | 2002-281750 | 9/2002 |
| JP | 2004-348636 | 12/2004 |
| JP | 2007-234896 | 9/2007 |
| WO | WO 94/16390 | 7/1994 |
| WO | WO 98/37672 | 8/1998 |
| WO | WO 99/21332 | 4/1999 |
| WO | WO 01/61951 | 8/2001 |
| WO | WO 2004/100473 | 11/2004 |

* cited by examiner

Primary Examiner — Adi Amrany

(74) Attorney, Agent, or Firm — Manabu Kanesaka

(57) ABSTRACT

Power electronics equipment includes a switching device directing current flow to a load and interrupting the current flowing to the load, a control circuit generating a control signal directing the conduction and non-conduction of the switching device, a driver circuit driving a control terminal of the switching device based on the control signal, and at least one air-cored insulating transformer insulating the control circuit and the driver circuit from each other. Each air-cored insulating transformer includes a primary winding and a secondary winding configured to generate a voltage by a change of interlinkage of a magnetic field. The secondary winding includes a plurality of coils configured such that voltages generated by external magnetic flux intersecting the secondary winding are canceled and a voltage generated by the signal magnetic flux intersecting the secondary winding is increased.

4 Claims, 22 Drawing Sheets

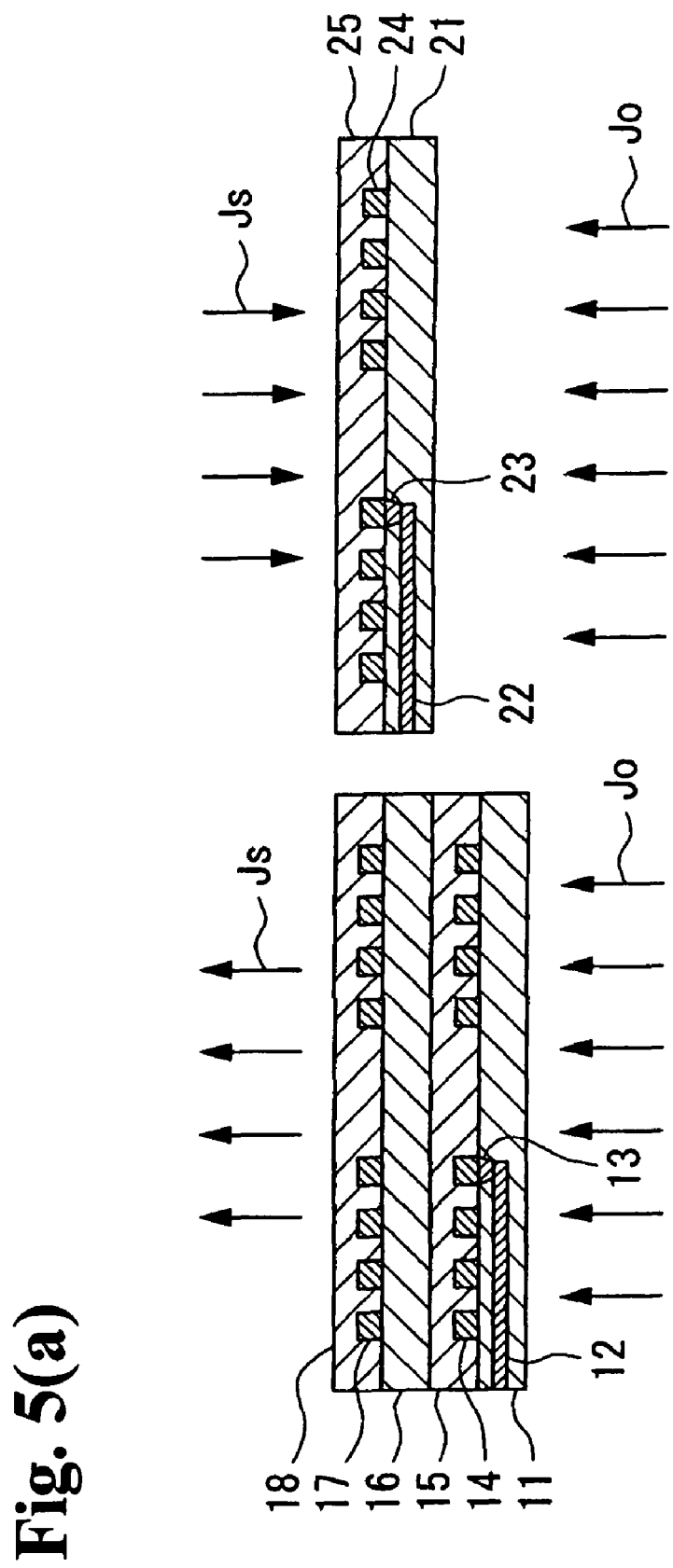

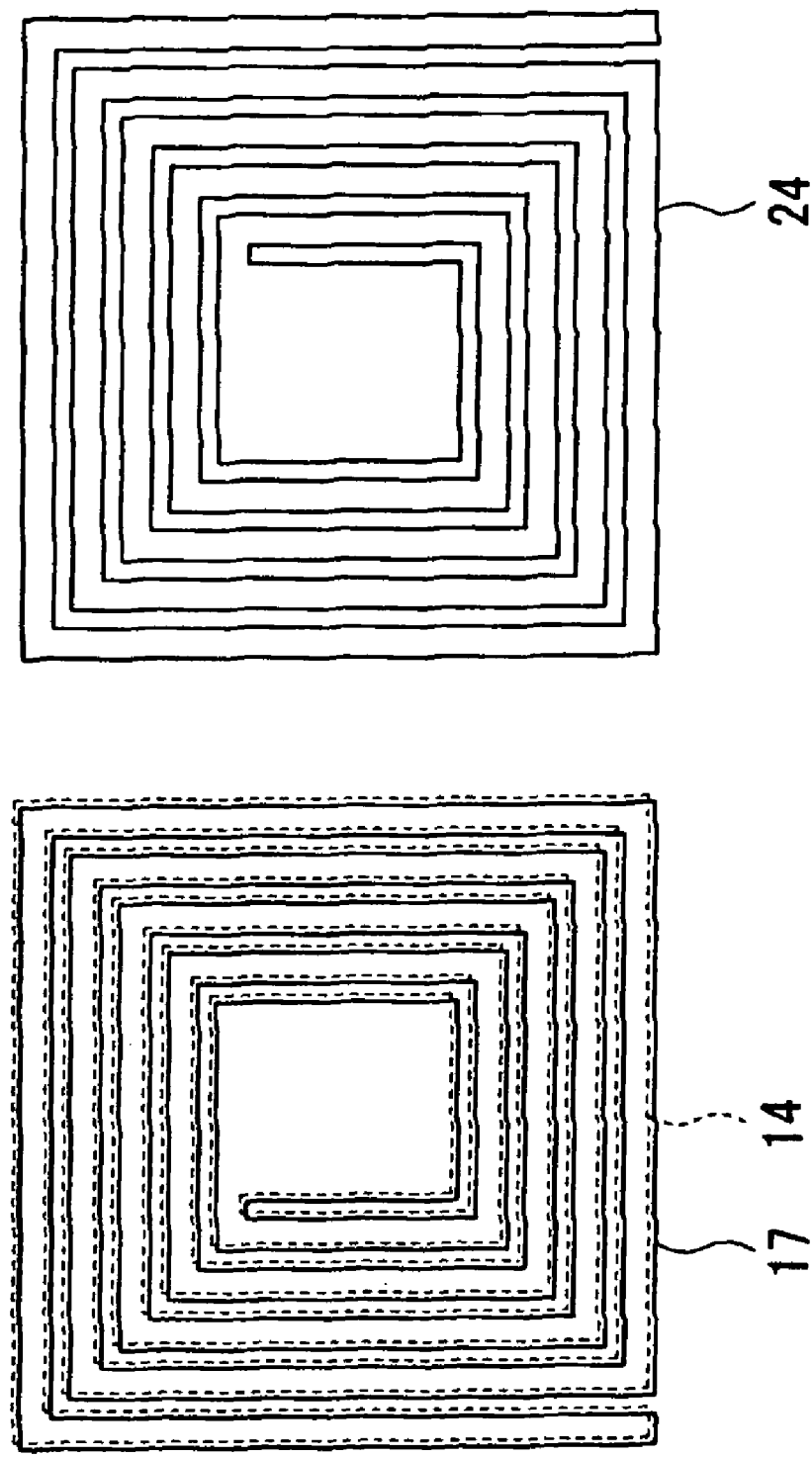

Fig. 7(b)
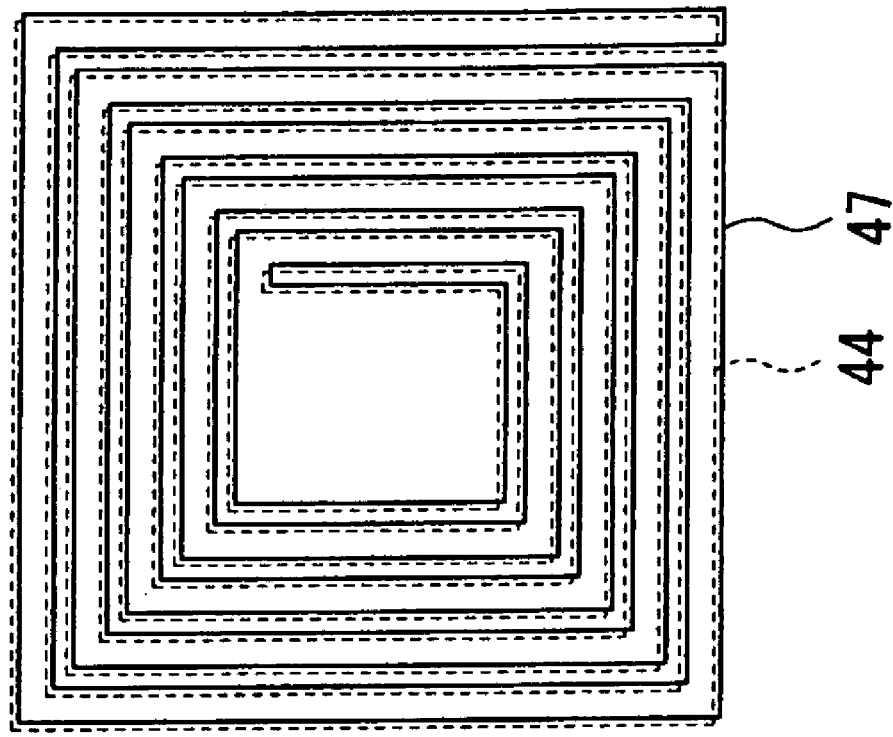
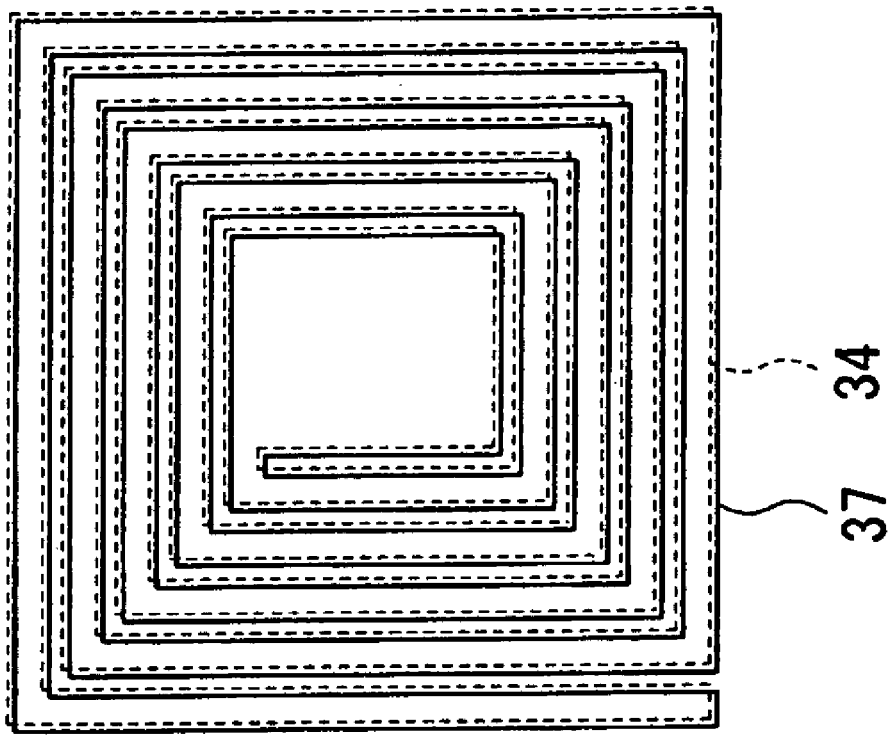

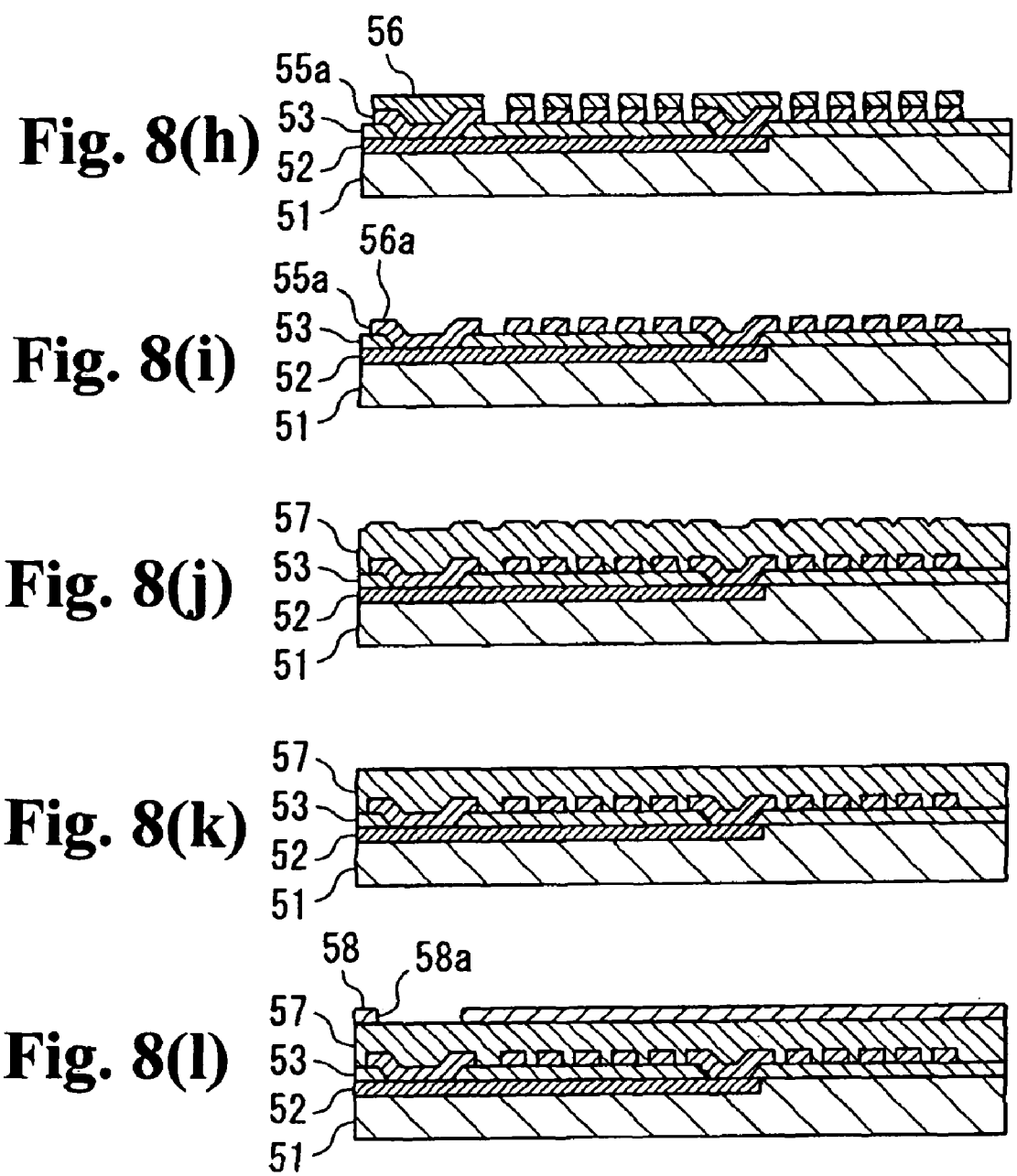

POWER ELECTRONICS EQUIPMENT FOR TRANSMITTING SIGNALS TO SWITCHING DEVICES THROUGH AIR-CORED INSULATING TRANSFORMER

BACKGROUND OF THE INVENTION AND RELATED ART STATEMENT

The present invention relates to power electronics equipment. Specifically, the present invention relates to power electronics equipment well suited for transmitting signals to switching devices via air-cored insulating transformers.

On-vehicle equipment mounts a step-up and step-down converter and an inverter on the driving system of a motor that generates driving power for improving conversion efficiency and for reducing the energy consumption.

FIG. 11 is a block diagram schematically showing a vehicle driving system that employs a conventional step-up and step-down converter.

Referring now to FIG. 11, the vehicle driving system includes a power supply 101 that feeds electric power to a step-up and step-down converter 102 that boosts and steps down a voltage, an inverter 103 that converts the voltage outputted from step-up and step-down converter 102 to the components of a three-phase voltage, and a motor 104 that drives the vehicle. Power supply 101 may comprise a voltage fed through overhead wires or batteries connected in series.

In driving the vehicle, step-up and step-down converter 102 boosts the voltage of power supply 101 (e.g. 280 V) to a voltage suited for driving motor 104 (e.g. 750 V) and feeds the boosted voltage to inverter 103. By controlling the ON and OFF of the switching devices in inverter 103, the voltage boosted by step-up and step-down converter 102 is converted to the components of a three-phase voltage and a current for each phase of motor 104 is made to flow. By controlling the switching frequency of inverter 103, the vehicle speed can be changed.

In braking the vehicle, inverter 103 controls the ON and OFF state of the switching devices, synchronizing the voltage components generated in the phases of motor 104 to conduct rectifying operations for converting the three-phase voltage to a DC voltage. The DC voltage feeds step-up and step-down converter 102. Step-up and step-down converter 102 steps down the voltage generated in motor 104 (e.g. 750 V) to supply the voltage of power supply 101 (e.g. 280 V) in order to conduct regeneration operations.

FIG. 12 is a block circuit diagram of the step-up and step-down converter shown in FIG. 11.

Referring now to FIG. 12, step-up and step-down converter 102 includes a reactor L for energy storage, capacitor C that accumulates electric charges, switching devices SW1 and SW2 that make a current flow into inverter 103 and interrupt the current flowing into inverter 103, and control circuits 111 and 112 that generate control signals directing the conduction and non-conduction of switching devices SW1 and SW2.

Switching devices SW1 and SW2 are connected in series. Power supply 101 is connected to the connection point of switching devices SW1 and SW2 via reactor L. In switching device SW1, an insulated gate bipolar transistor (hereinafter referred to as an "IGBT") 105 that conducts switching operations in response to the control signal from control circuit 111 is disposed. A free-wheel diode D1, which makes a current flow in the direction opposite to the flow direction of the current flowing through IGBT 105, is connected in parallel to IGBT 105.

In switching device SW2, an IGBT 106 that conducts switching operations in response to the control signal from control circuit 112 is disposed. A free-wheel diode D2, which makes a current flow in the direction opposite to the flow direction of the current flowing through IGBT 106, is connected in parallel to IGBT 106. The collector of IGBT 106 is connected to capacitor C and inverter 103.

FIG. 13 is a wave chart describing the waveform of the current flowing through reactor L shown in FIG. 12 in the boosting operation.

Referring now to FIG. 13, as IGBT 105 in switching device SW1 turns ON (conductive) in the boosting operation, a current I flows through reactor L via IGBT 105, storing the energy of $LI^2/2$ in reactor L.

Then, as IGBT 105 in switching device SW1 turns OFF (becomes nonconductive), a current flows through free-wheel diode D2 in switching device SW2, transferring the energy stored in reactor L to capacitor C.

In the stepping down operation, as IGBT 106 in switching device SW2 turns ON (becomes conductive), a current I flows through reactor L via IGBT 106, storing the energy of $LI^2/2$ in reactor L.

Then, as IGBT 106 in switching device SW2 turns OFF (becomes nonconductive), a current flows through free-wheel diode D1 in switching device SW1, regenerating the energy stored in reactor L to power supply 101.

By changing the ON-period (ON duty) of the switching devices, the boosted and stepped down voltages may be adjusted. The approximate voltage value is obtained from the following formula (1).

$$V_L/V_H = \text{ON duty (\%)} \tag{1}$$

Here, $V_L$ is the power supply voltage, $V_H$ is the voltage after the boosting or the stepping down, and the ON duty is the ratio of the conduction period of switching device SW1 or SW2 to the switching period thereof.

Since variations are caused in the load and the power supply voltage $V_L$ in practice, the ON period (ON duty) of switching devices SW1 or SW2 is controlled by means of monitoring the voltage $V_H$ after the boosting or the stepping down so that the voltage $V_H$ after the boosting or the stepping down may be equal to the reference value.

Since control circuits 111 and 112 grounded to the vehicle body are on the low voltage side, the arms connected to switching devices SW1 and SW2 are on the high voltage side. So as not to expose any human body to danger even if an accident such as the breakdown of switching device SW1 or SW2 occurs, signal transmission and reception are conducted between the arms and control circuits 111, 112 via insulating transformers, while the arms and control circuits 111, 112 are electrically insulated from each other by the insulating transformers.

FIG. 14 is a top plan view schematically showing a conventional insulating transformer for signal transmission. Referring now to FIG. 14, the insulating transformer includes a magnetic core MC. A primary winding M1 and a secondary winding M2 are wound around magnetic core MC. Magnetic core MC may be made of ferrite, permalloy, and similar ferromagnetic material. The magnetic flux φ generated by the current fed to primary winding M1 is localized into magnetic core MC and made to pass through magnetic core MC. Magnetic flux intersects secondary winding M2, generating a voltage dφ/dT across secondary winding M2. Since a closed magnetic path is formed by using magnetic core MC, the adverse effects of the external magnetic field are reduced and the coupling coefficient of primary winding M1 and secondary winding M2 is increased.

FIG. 15 is a block diagram of a signal transmission circuit using a conventional insulating transformer for signal transmission.

Referring now to FIG. 15, a first end of the primary winding in an insulating transformer T is connected to the drain of a field effect transistor M1 via a resistor R1, and a first end of the secondary winding in insulating transformer T is connected to a demodulator circuit 203. A local oscillation signal generated in a local oscillator circuit 201 is inputted to a modulator circuit 202. As a PWM signal SP is inputted to modulator circuit 202, the local oscillation signal is modulated by PWM signal SP and the modulated local oscillation signal is inputted to the gate of field effect transistor M1 for the control signal thereof. As the control signal is inputted to the gate of field effect transistor M1, a modulated signal modulated at a high frequency, is inputted to demodulator circuit 203 via insulating transformer T and PWM signal SP is demodulated in demodulator circuit 203.

Patent Document 1 discloses a method of transmitting NRZ (Non Return Zero) data signals through an interface comprised of an isolation barrier and arranged between a first device and a second device connected via a bus to each other, wherein a pulse transformer is employed for the isolation barrier.

Patent Document 2 discloses the connection of a driver formed on a first substrate and a receiver formed on a second substrate by the magnetic coupling using coils.

Patent Document 3 discloses the use of a link coupling transformer as a logic separation circuit for isolating an input circuit and an output circuit from each other.

[Patent Document 1] Japanese Patent 3399950 (Counterpart U.S. Pat. No. 5,384,808)

[Patent Document 2] Published Japanese Translation of PCT International Publication for Patent Application 2001-521160 (Counterpart U.S. Pat. No. 6,054,780)

[Patent Document 3] Published Japanese Translation of PCT International Publication for Patent Application 2001-513276 (Counterpart U.S. Pat. No. 5,952,849)

However, the use of a cored transformer as an insulating transformer for signal transmission is adversely affected by the temperature dependence of the magnetic permeability of a magnetic core material, the high temperature dependence of the coupling coefficient, and the difficulties in reducing the costs and dimensions of the apparatus. Since it is impossible to directly send the PWM signal via the cored transformer, it is necessary to demodulate the signal, modulated at a high frequency, after the modulated signal is received by the secondary winding. Therefore, the circuit scale is inevitably large.

Since the use of an air-cored transformer as an insulating transformer for signal transmission does not employ any magnetic core, the use of the air-cored transformer facilitates reducing the costs and dimensions of the apparatus. However, since the magnetic circuit is not closed, external magnetic fluxes are liable to be superimposed onto the secondary winding as noises, causing malfunctions.

In view of the foregoing, it would be desirable to provide power electronic equipment that facilitates reducing the temperature dependence of the coupling coefficient, reducing the adverse effects of the noises caused by the external magnetic fluxes, and transmitting and receiving signals between the high and low voltage sides while insulating the high and low voltage sides electrically from each other.

Further objects and advantages of the invention will be apparent from the following description of the invention.

SUMMARY OF THE INVENTION

According to the subject matter of the first aspect, there is provided power electronic equipment including switching devices making a current flow to a load and interrupting the current flowing to the load; a control circuit generating control signals directing the conduction and non-conduction of the switching devices; driver circuits driving the control terminals of the respective switching devices based on the control signals; air-cored insulating transformers, each including a primary winding on a transmitter side and a secondary winding on a receiver side such that the control circuit and the driver circuits are insulated from each other; and the secondary winding including a plurality of coils configured such that the voltages caused by the external magnetic flux intersecting the secondary winding are canceled and the voltage generated by the signal magnetic flux intersecting the secondary winding is increased. The primary winding is a winding to generate a magnetic field, and the secondary winding is a winding on a receiver side to generate a voltage by a change of interlinkage of a magnetic field.

The secondary winding, including a plurality of coils, facilitates canceling the voltages caused by the external magnetic flux intersecting the secondary winding and reducing a noise, that is a voltage induced in the secondary windings, which was superposed on the secondary windings due to the external magnetic flux. Therefore, signals are transmitted and received between the control circuit and the switching devices without causing any malfunction, while the control circuit and the switching devices are insulated from each other. Furthermore, the costs and the dimensions of the power electronic equipment are reduced.

According to the subject matter of the second aspect, the secondary winding includes a first secondary coil and a second secondary coil arranged adjacently to each other, the winding direction of the first secondary coil is opposite to the winding direction of the second secondary coil, the primary winding and the first secondary coil are arranged in a coaxial relationship, and the tail of the first secondary coil is connected to the head of the second secondary coil or the head of the first secondary coil is connected to the tail of the second secondary coil.

The secondary coils, of which the winding directions are opposite to each other, facilitate canceling the voltages caused by the external magnetic flux intersecting the secondary winding. Therefore, the superposition of the external magnetic flux onto the secondary winding as noises is reduced even when air-cored insulating transformers are used for signal transmission. Furthermore, malfunctions are prevented from occurring, and the costs and the dimensions of the power electronic equipment are reduced.

According to the subject matter of the third aspect, the secondary winding includes a first secondary coil and a second secondary coil arranged adjacently to each other, the winding direction of the first secondary coil is the same as the winding direction of the second secondary coil, the primary winding and the first secondary coil are arranged in a coaxial relationship, and the head of the first secondary coil is connected to the head of the second secondary coil or the tail of the first secondary coil is connected to the tail of the second secondary coil.

Even when the winding directions of the secondary coils are the same, it is possible, by changing the way of connecting the secondary coils, to cancel the voltages caused by the external magnetic flux intersecting the secondary winding. Therefore, the superposition of the external magnetic flux onto the secondary winding as noises is reduced even when air-cored insulating transformers are used for signal transmission. Furthermore, malfunctions are prevented from occurring, and the costs and the dimensions of the power electronics equipments are reduced.

According to the subject matter of the forth aspect, a power electronics equipment includes switching devices making a current flow to a load and interrupting the current flowing to the load; a control circuit generating control signals directing the conduction and non-conduction of the switching devices; driver circuits driving the control terminals of the respective switching devices based on the control signals; air-cored insulating transformers, each transformer including a primary winding on a transmitter side and a secondary winding on a receiver side such that the control circuit and the driver circuits are insulated from each other; the primary winding including a plurality of coils configured such that the voltage generated by the signal magnetic flux intersecting the secondary winding is increased; and the secondary winding including a plurality of coils configured such that the voltages caused by the external magnetic flux intersecting the secondary winding are canceled and the voltage generated by the signal magnetic flux intersecting the secondary winding is increased.

The provisions of the primary coils and the secondary coils facilitate canceling a voltage induced by the external magnetic fluxes intersecting the primary and secondary windings and reducing the superposition of the external magnetic fluxes onto the primary and secondary windings as noises without using any magnetic core. Therefore, signals are transmitted and received between the control circuit and the switching devices without causing any malfunction. Furthermore, the control circuit and the switching devices are insulated from each other and the costs and the dimensions of the power electronics equipments are reduced.

According to the fifth aspect, the primary winding includes a first primary coil and a second primary coil arranged adjacent to each other; the winding direction of the first primary coil is opposite to the winding direction of the second primary coil; the secondary winding includes a first secondary coil and a second secondary coil arranged adjacent to each other; the winding direction of the first secondary coil is opposite to the winding direction of the second secondary coil; the first primary coil and the first secondary coil are arranged in a coaxial relationship; the second primary coil and the second secondary coil are arranged in a coaxial relationship; the tail of the first primary coil is connected to the head of the second primary coil or the head of the first primary coil is connected to the tail of the second primary coil; and the tail of the first secondary coil is connected to the head of the second secondary coil or the head of the first secondary coil is connected to the tail of the second secondary coil.

The primary coils, wherein the winding directions are opposite to each other, and the secondary coils, wherein the winding directions are opposite to each other, facilitate canceling the voltages caused by the external magnetic flux intersecting the primary and secondary windings. Therefore, the superposition of the external magnetic flux onto the primary and secondary windings as noise is reduced even when air-cored insulating transformers are used for signal transmission. Malfunctions are prevented from occurring, and the costs and the dimensions of the power electronics equipments are reduced.

According to the sixth aspect, the primary winding includes a first primary coil and a second primary coil arranged adjacent to each other; the winding direction of the first primary coil is the same as the winding direction of the second primary coil; the secondary winding includes a first secondary coil and a second secondary coil arranged adjacent to each other; the winding direction of the first secondary coil is the same as the winding direction of the second secondary coil; the first primary coil and the first secondary coil are arranged in a coaxial relationship; the second primary coil and the second secondary coil are arranged in a coaxial relationship; the head of the first primary coil is connected to the head of the second primary coil or the tail of the first primary coil is connected to the tail of the second primary coil; and the head of the first secondary coil is connected to the head of the second secondary coil, or the tail of the first secondary coil is connected to the tail of the second secondary coil.

Even when the winding directions of the primary coils are the same and the winding directions of the secondary coils are the same, it is possible, by changing the way of connecting the primary coils and the way of connecting the secondary coils, to cancel the voltages caused by the external magnetic flux intersecting the primary and secondary windings. Therefore, the superposition of the external magnetic flux onto the primary and secondary windings as noises is reduced even when air-cored insulating transformers are used for signal transmission. Malfunctions are prevented from occurring, and the costs and the dimensions of the power electronics equipments are reduced.

According to a seventh aspect, the number of turns of the first secondary coil and the number of turns of the second secondary coil are almost the same. Since the magnetic fluxes intersecting the first and second secondary coils are almost the same as when the number of turns of the first and second secondary coils are almost the same, the voltages generated by the magnetic fluxes intersecting the first and second secondary coils are almost perfectly canceled.

According to an eighth aspect, the air-cored insulating transformers are manufactured by micro-machining techniques. The manufacture of the air-cored insulating transformers by micro-machining techniques facilitates shortening the winding diameters of the primary and secondary windings and shortening the spacing between the primary and secondary windings. Therefore, the coupling coefficient of the primary and secondary windings is improved, the adverse effects of the external magnetic flux intersecting the primary and secondary windings as noises are reduced, and the S/N ratio is improved.

As described above, the voltages caused by the external magnetic flux intersecting the secondary winding are canceled, the superposition of the external magnetic flux onto the secondary winding as noise is reduced even when air-cored insulating transformers are used for signal transmission, malfunctions are prevented from occurring, and the costs and dimensions of the power electronic equipment are reduced.

BRIEF DESCRIPTION OF THE DRAWINGS

FIG. 5($a$) is a cross sectional view schematically showing an insulating transformer according to a second embodiment of the invention.

FIG. 5($b$) is a top plan view of the insulating transformer shown in FIG. 5($a$).

FIG. 7(b) is a top plan view of the insulating transformer shown in FIG. 7(a).

FIGS. 8(a) through 8(l) are cross sectional views describing the manufacturing steps for manufacturing an insulating transformer according to a fifth embodiment of the invention.

DETAILED DESCRIPTION OF THE EMBODIMENTS

Now the invention will be described in detail hereinafter with reference to the accompanied drawings, which illustrate the specific embodiments of the invention.

Figure 1:
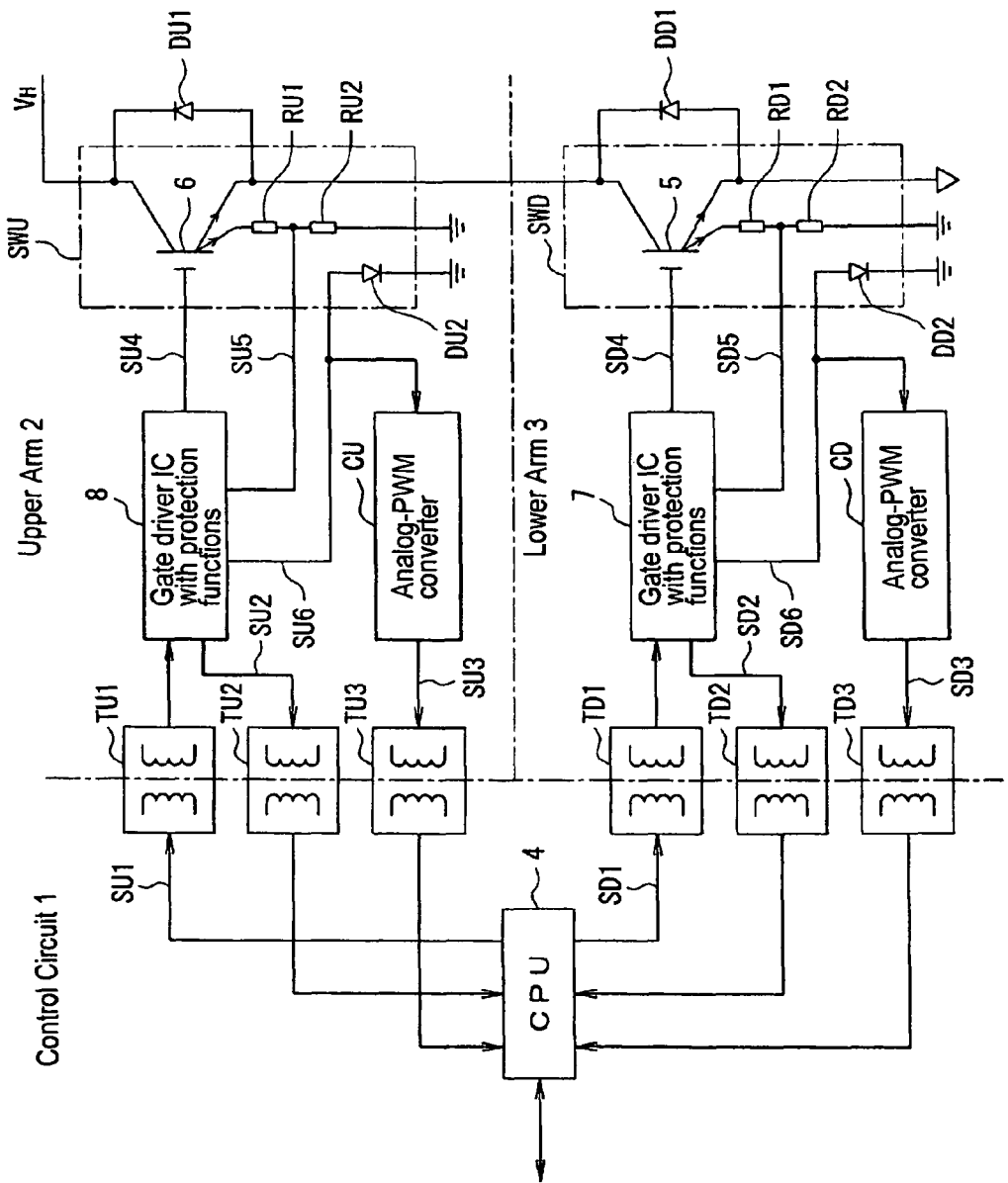
FIG. 1 is a block diagram schematically showing an intelligent power module for a step-up and step-down converter, to which power electronics equipment according to a first embodiment of the invention is applied.

FIG. 1 is a block diagram schematically showing an intelligent power module (hereinafter referred to as an "IPM") for a step-up and step-down converter, to which a power electronics equipment according to the first embodiment of the invention is applied.

Referring now to FIG. 1, the IPM for the step-up and step-down converter according to the first embodiment includes a switching device SWU for an upper arm and a switching device SWD for a lower arm that make a current flow to the load and interrupt the current flowing to the load. A control circuit 1 generates control signals directing the conduction and non-conduction of switching devices SWU and SWD. Control circuit 1 may be comprised of a CPU 4 or a logic IC, or a system LSI that mounts a logic IC and a CPU thereon.

Switching devices SWU and SWD are connected in series so that switching devices SWU and SWD may work for upper arm 2 and for lower arm 3, respectively. An IGBT 6 that conducts switching operations in response to a gate signal SU4 is disposed in switching device SWU. A free-wheel diode DU1 that makes a current flow in a direction opposite to the flow direction of the current flowing through IGBT 6 is connected in parallel to IGBT 6.

On the chip, in which IGBT 6 is formed, a temperature sensor is disposed, using as its measurement principle, the VF (Forward Voltage) change of a diode DU2 caused by the chip temperature change. A current sensor, which detects the main circuit current by dividing the emitter current of IGBT 6 with resistors RU1 and RU2, is further disposed.

An IGBT 5 that conducts switching operations in response to a gate signal SD4 is disposed in switching device SWD. A free-wheel diode DD1 that makes a current flow in the direction opposite to the flow direction of the current flowing through IGBT 5 is connected in parallel to IGBT 5. On the chip on which IGBT 5 is formed, a temperature sensor is disposed that measures chip temperature change by measuring the VF change of a diode DD2. In addition, a current sensor is formed on the chip that detects the main circuit current by dividing the emitter current of IGBT 5 with resistors RD1 and RD2.

Agate driver IC 8 is disposed on the side of upper arm 2. Driver IC 8 includes protection functions that monitors an overheat detection signal SU6 from the temperature sensor and an overcurrent detection signal SU5 from the current sensor. Furthermore, Driver IC 8 generates gate signal SU4 for driving the control terminal of IGBT 6. An analog-PWM converter CU is also disposed on the side of upper arm 2, which generates a PWM signal corresponding to the temperature of IGBT 6.

A gate driver IC 7 is disposed on the side of lower arm 3, and includes protection functions that monitors an overheat detection signal SD6 from the temperature sensor and monitors an overcurrent detection signal SD5 from the current sensor. In addition, gate driver IC 7 generates gate signal SD4 for driving the control terminal of IGBT 5. An analog-PWM converter CD that generates a PWM signal corresponding to the temperature of IGBT 5 is also disposed on the side of lower arm 3.

Air-cored insulating transformers TU1 through TU3 are inserted between control circuit 1 grounded to the vehicle body and upper arm 2 biased at a high voltage. Air-cored insulating transformers TD1 through TD3 are inserted between control circuit 1 grounded to the vehicle body and lower arm 3 biased at a high voltage. Control circuit 1 transmits signals to upper arm 2 and receives signals from upper arm 2 via air-cored insulating transformers TU1 through TU3 while control circuit 1 is insulated electrically from upper arm 2 by air-cored insulating transformers TU1 through TU3. Control circuit 1 transmits signals to lower arm 3 and receives signals from lower arm 3 via air-cored insulating transformers TD1 through TD3. In addition, control circuit 1 is insulated electrically from lower arm 3 by air-cored insulating transformers TD1 through TD3.

In detail, on the side of upper arm 2, a PWM (Pulse Width Modulation) signal SU1 for gate driving is an output of CPU 4 and is inputted to gate driver IC 8 (with protection functions) via air-cored insulating transformer TU1. An alarm signal SU2 outputted from gate driver IC 8 (with protection functions) is inputted to CPU 4 via air-cored insulating transformer TU2. A PWM signal SU3 representative of the IGBT chip temperature and outputted from analog-PWM converter CU is inputted to CPU 4 via air-cored insulating transformer TU3.

On the side of lower arm 3, a gate driving signal, PWM signal SD1, is output from CPU 4 and is inputted to gate driver IC 7, which provides protection functions, via air-cored insulating transformer TD1. An alarm signal SD2 outputted from gate driver IC 7, which provides protection functions, is inputted to CPU 4 via air-cored insulating transformer TD2. A PWM signal SD3 indicating the IGBT chip temperature and outputted from analog-PWM converter CD is inputted to CPU 4 via air-cored insulating transformer TD3.

Each of air-cored insulating transformers TU1 through TU3 and TD1 through TD3 includes a primary winding on the transmitting side thereof and a secondary winding on the receiving side thereof. Each of the secondary windings in air-cored insulating transformers TU1 through TU3 and TD1 through TD3 is comprised of a plurality of coils configured such that the voltages generated by the external magnetic flux intersecting the secondary winding are canceled, and the voltage generated by the signal magnetic flux intersecting the secondary winding is increased.

CPU 4 generates PWM gate driving signals PWMSD1 and SU1 that direct the conduction and non-conduction of IGBTs 5 and 6. CPU 4 transmits PWM signals SD1 and SU1 in an insulated manner to gate driver ICs 7 and 8 (with protection functions) via air-cored insulating transformers TD1 and TU1. Gate driver ICs 7 and 8 with protection functions generate gate signals SD4 and SU4 based on gate driving PWM signals SD1 and SU1 and drive the control terminals of IGBTs 5 and 6 to make IGBTs 5 and 6 conduct switching operations.

Overheat detection signals SD6 and SU6 outputted from the temperature sensors and overcurrent detection signals SD5 and SU5 outputted from the current sensors are inputted to gate driver ICs 7 and 8 that provide protection functions. When any of overheat detection signals SD6 and SU6, or any of overcurrent detection signals SD5 and SU5 exceeds the threshold temperature value or the threshold current value, at which IGBTs 5 and 6 are not broken down, to the higher side, gate driver IC 7 or IC 8 sends alarm signal SD2 or SU2 to CPU 4 via air-cored insulating transformer TD2 or TU2. As CPU 4 receives alarm signal SD2 or SU2, CPU 4 stops generating gate driving PWM signals SD1 and SU1, interrupting the currents flowing through IGBTs 5 and 6.

Because a certain period of time passes from the instant at which gate driver ICs 7 and 8 (which provides protection functions) determined that overheat detection signals SD6, SU6 and overcurrent detection signals SD5, SU5 exceeded the respective threshold values to the lower sides, gate driver ICs 7 and 8 (providing protection functions) cancel alarm signals SD2 and SU2.

For monitoring more closely, overheat detection signals SD6 and SU6 outputted from the temperature sensors are inputted to analog-PWM converters CD and CU. Analog-PWM converters CD and CU convert the analog values of overheat detection signals SD6 and SU6 to the respective digital signals to generate IGBT-chip-temperature PWM signals SD3 and SU3 PWM which are transmitted to CPU 4 via air-cored insulating transformers TD3 and TU3. CPU 4 calculates the chip temperatures of IGBTs 5 and 6 from IGBT-chip-temperature PWM signals SD3 and SU3. CPU 4 decreases the switching frequencies of IGBTs 5 and 6 or makes IGBTs 5 and 6 stop switching with reference to the predetermined several threshold temperature levels.

By forming each of the secondary windings in air-cored insulating transformers TU1 through TU3 and TD1 through TD3 of a plurality of coils, the voltages generated by the external magnetic flux intersecting the secondary winding are canceled and noise, generated by the superposition of the external magnetic flux onto the secondary winding, is prevented from occurring.

Therefore, the configuration of the secondary winding described above facilitates transmitting and receiving signals between control circuit 1 and upper and lower arms 2, 3 while insulating control circuit 1 electrically from upper and lower arms 2 and 3, preventing malfunctions from occurring, and reducing the costs and dimensions of the IPM for the step-up and step-down converter.

Figure 2:
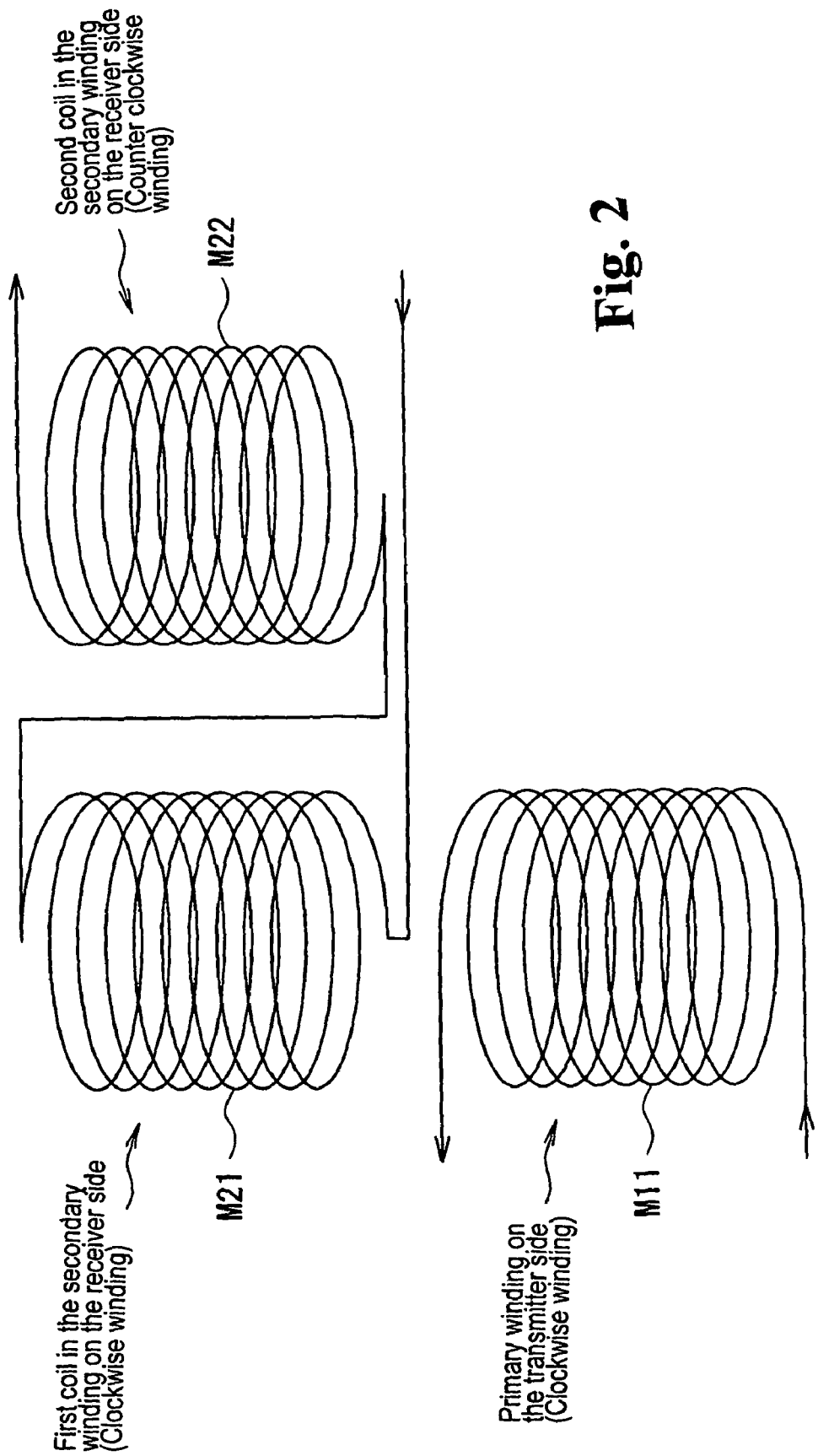
FIG. 2 schematically shows the external appearance of an air-cored insulating transformer according to the first embodiment of the invention.

FIG. 2 schematically shows the external appearance of an air-cored insulating transformer according to the first embodiment of the invention.

Referring now to FIG. 2, each of air-cored insulating transformers TU1 through TU3 and TD1 through TD3 shown in FIG. 1 includes a primary winding M11 working as a transmitter and a secondary winding working as a receiver. The secondary winding is comprised of a first secondary coil M21 and a second secondary coil M22. First secondary coil M21 and second secondary coil M22 in the secondary winding are configured such that the voltages generated by the external magnetic flux intersecting the secondary winding are canceled and the voltage generated by the signal magnetic flux intersecting the secondary winding is intensified.

For example, the winding direction of first secondary coil M21 and the winding direction of second secondary coil M22 are set to be opposite to each other and first secondary coil M21 and second secondary coil M22 are arranged in a coaxial relationship to each other. Further, primary winding M11 and first secondary coil M21 are arranged in a coaxial relationship and the winding direction of primary winding M11 and the winding direction of first secondary coil M21 are set to be the same. Furthermore, the tail of first secondary coil M21 is connected to the head of second secondary coil M22, or the head of first secondary coil M21 is connected to the tail of second secondary coil M22. It is preferable to set the number of turns in first secondary coil M21 to be almost the same as the number of turns in second secondary coil M22.

By setting the winding direction of first secondary coil M21 and the winding direction of second secondary coil M22 to be opposite to each other, the voltages caused by the external magnetic flux intersecting the secondary winding are canceled. The configuration of the secondary winding described above facilitates reducing the noise caused by the superposition of the external magnetic flux onto the secondary winding even when air-cored insulating transformers TU1 through TU3 and TD1 through TD3 are used for signal transmission. Furthermore, malfunctions are prevented from occurring, and costs and dimensions of the IPM for the step-up and step-down converter are reduced.

Figure 3:
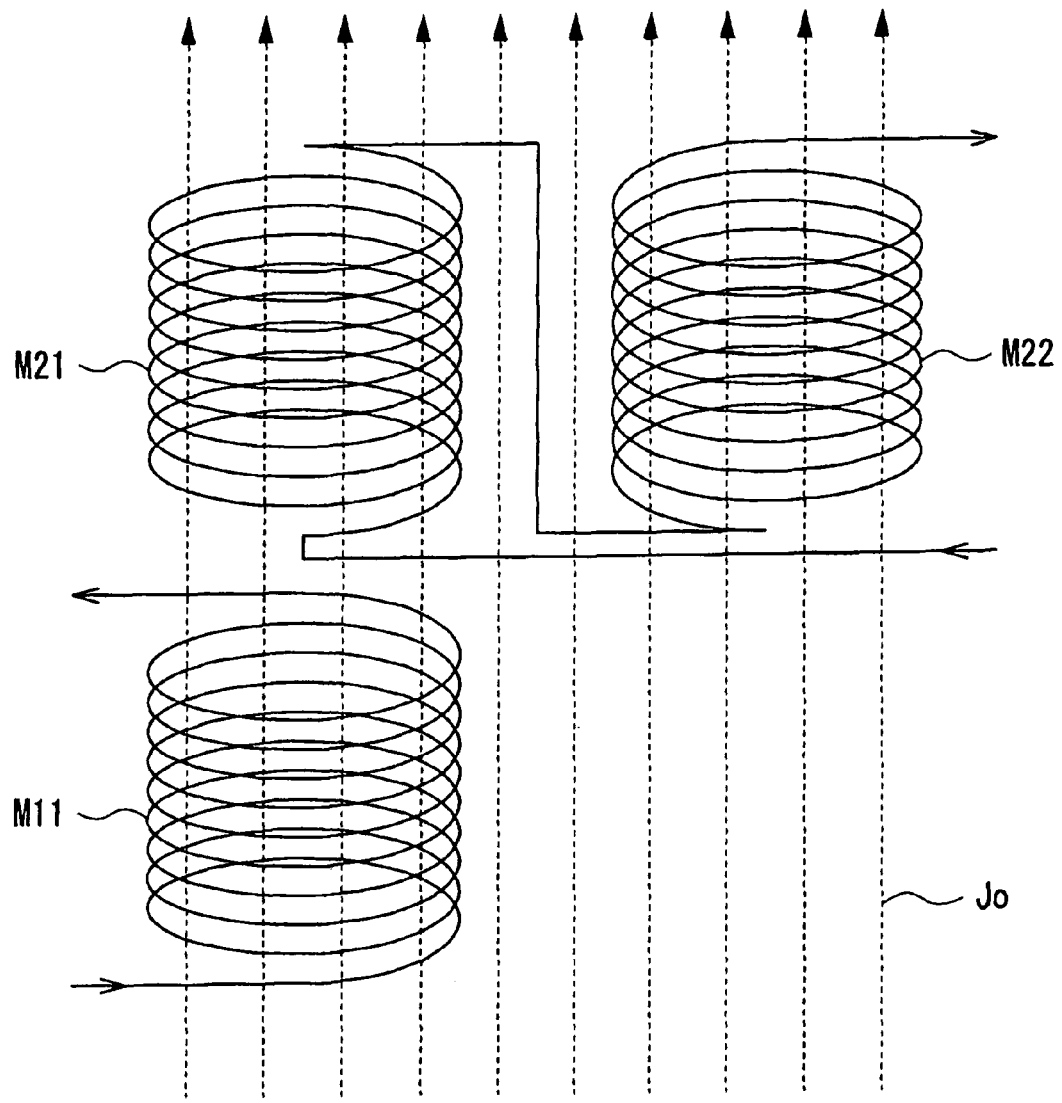
FIG. 3 is a drawing describing the intersection of an external magnetic flux in the air-cored insulating transformer shown in FIG. 2.

FIG. 3 is a drawing describing the intersection of an external magnetic flux in the air-cored insulating transformer shown in FIG. 2.

Referring now to FIG. 3, an external magnetic flux $J_O$ intersects first secondary coil M21 and second secondary coil M22 in the secondary winding almost uniformly in the same direction.

Figure 4:
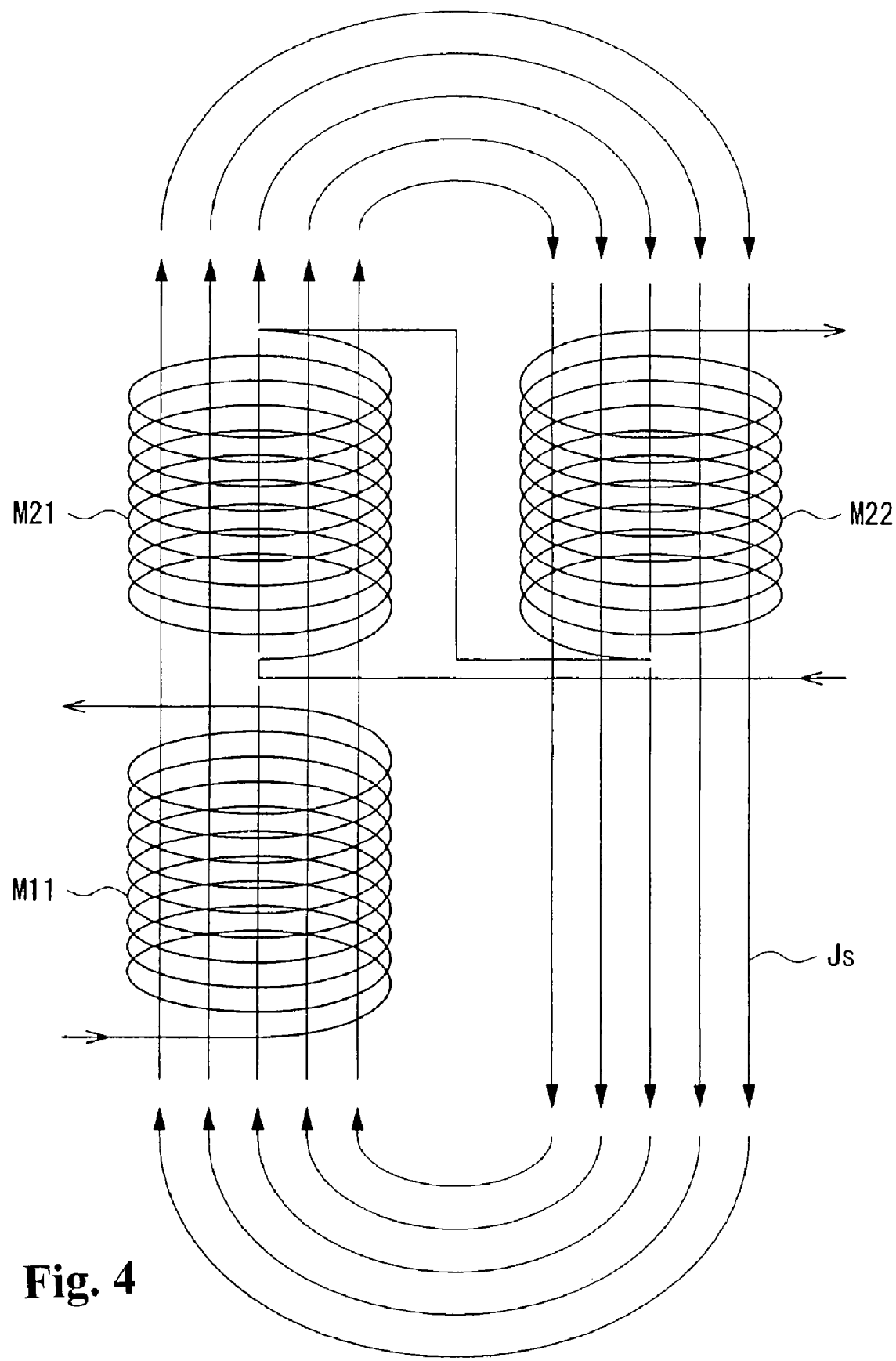
FIG. 4 is a drawing describing the intersection of a signal magnetic flux in the air-cored insulating transformer shown in FIG. 2.

FIG. 4 is a drawing describing the intersection of a signal magnetic flux in the air-cored insulating transformer shown in FIG. 2.

Referring now to FIG. 4, a signal magnetic flux $J_S$ is generated by a signal current flowing through primary winding M11 such that signal magnetic flux $J_S$ localizes around the axis of primary winding M11 and circulates along the axis of primary winding M11. Almost all the parts of signal magnetic flux $J_S$ intersect first secondary coil M21 arranged in a coaxial relationship above primary winding M11 and a part of signal magnetic flux $J_S$ intersects second secondary coil M22.

When the magnetic flux intersecting a circulating winding changes, the voltage generated across the winding is defined by the following Faraday's law.

$$\oint E \cdot dl = -\int_s (\partial B/\partial t) \cdot dS \quad (2)$$

Here, the bold letters in the formula (2) represent vectors. As one knows from formula (2), the factors that affect the sign of the voltage generated by the magnetic flux change include the winding direction of the winding (dS) and the magnetic flux direction (B) The voltage generated across first secondary coil M21 of the secondary winding is caused by the external magnetic flux Jo generated by the main circuit current. The voltage generated across second secondary coil M22 of the secondary winding is caused by the external magnetic flux $J_O$. The sign of the voltage across the first secondary coil M21 is opposite to the sign of the voltage across the second secondary coil M22 because the winding direction of first secondary coil M21 is opposite to the winding direction of second secondary coil M22. Therefore, the voltages generated across first secondary coil M21 and second secondary coil M22 cancel each other. Since the absolute values of the voltages generated across first secondary coil M21 and second secondary coil M22 are almost the same when the number of turns in first secondary coil M21 and the number of turns in second secondary coil M22 are almost the same, the cancellation of the voltages generated across first secondary coil M21 and second secondary coil M22 is most effective when the number of turns in first secondary coil M21 and the number of turns in second secondary coil M22 are almost the same.

In contrast, signal magnetic flux $J_S$ generates voltages across first secondary coil M21 and second secondary coil M22 in the same direction, increasing the resultant generated voltage level. Since the secondary winding, as configured above, facilitates increasing the resultant voltage level generated by signal magnetic flux $J_S$ and suppressing the resultant voltage level caused by external magnetic flux $J_O$, the S/N ratio of the signals transmitted via air-cored insulating transformers TU1 through TU3 and TD1 through TD3 shown in FIG. 1 is improved.

Figure 17A:
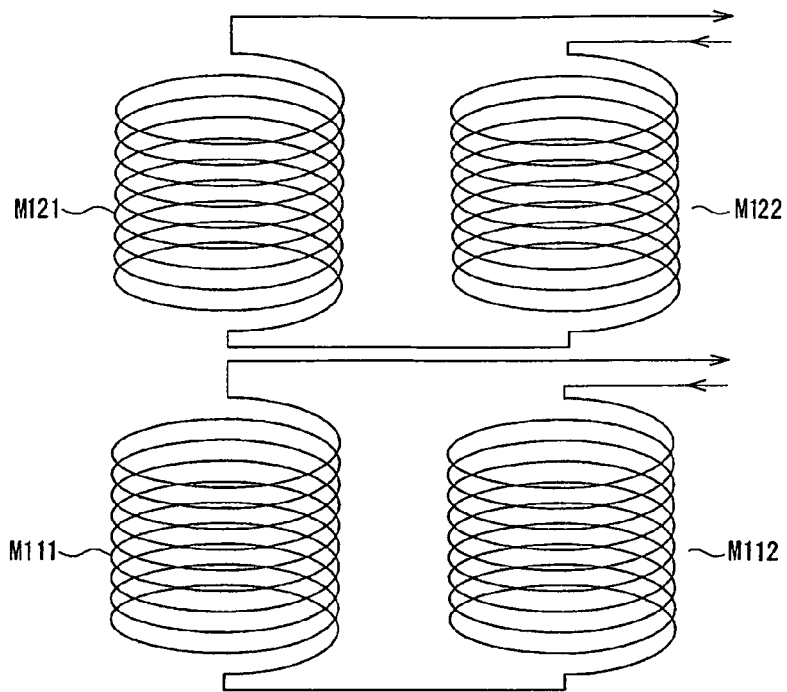
FIG. 17 schematically shows the external appearance of an air-cored insulating transformer in which the first primary coil and the first secondary coil are arranged in a coaxial relationship, the second primary coil and the second secondary coil are arranged in a coaxial relationship, and a winding direction of the first primary coil is the same as a winding direction of the second primary coil.
Figure 17B:
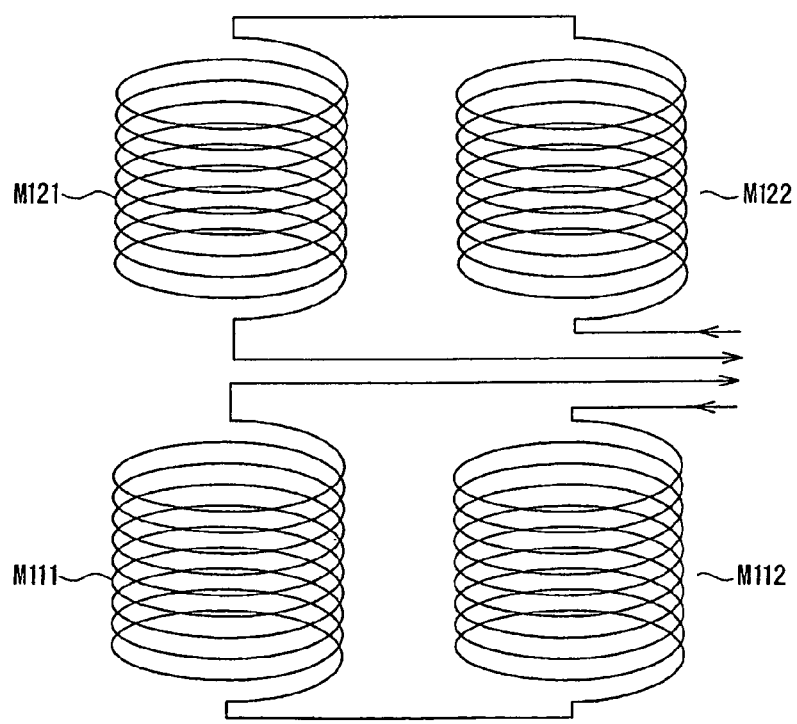
Figure 17C:
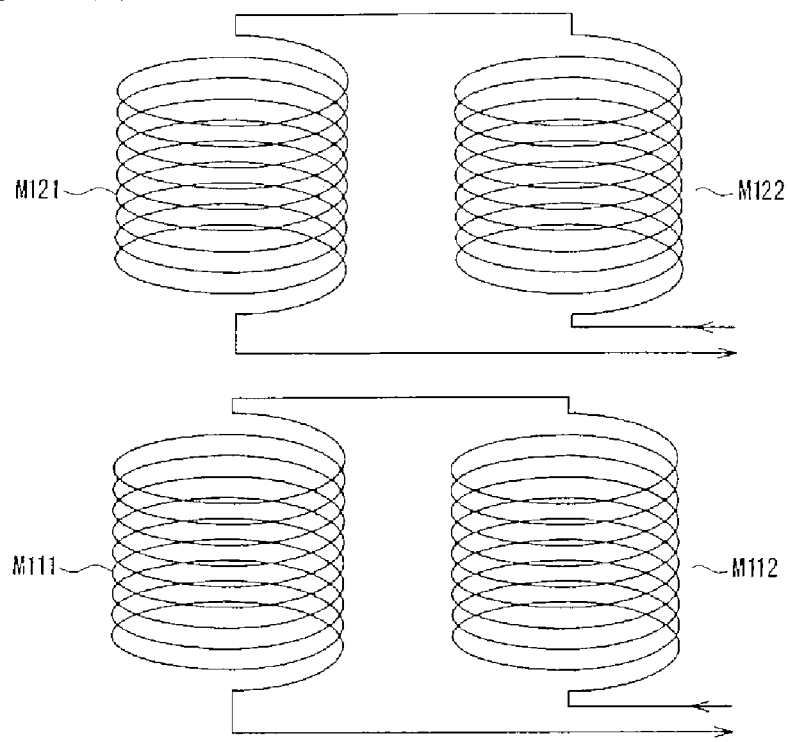
Figure 17D:
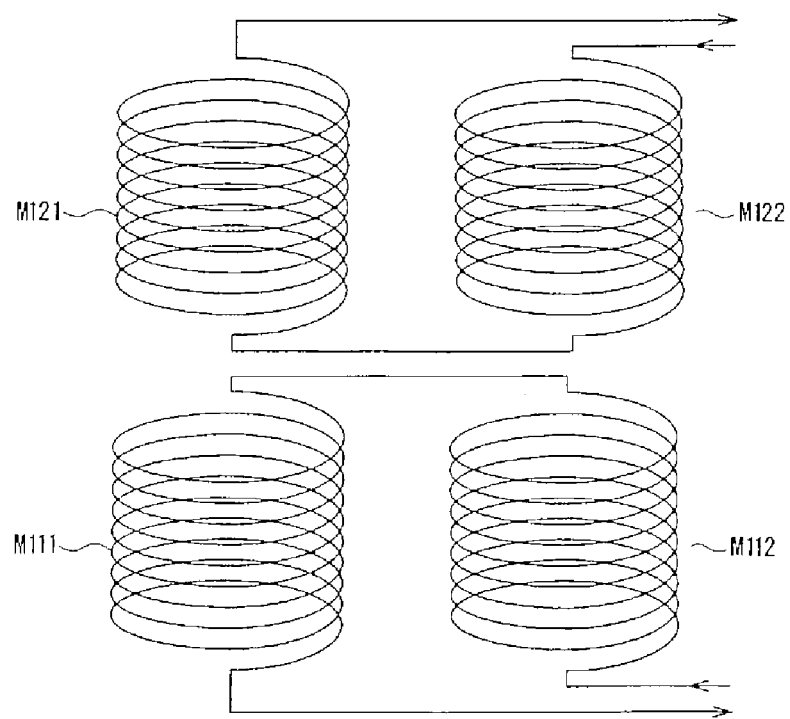

In the embodiment described above, the winding direction of first secondary coil M21 and the winding direction of second secondary coil M22 are set to be opposite to each other. In addition, the tail of first secondary coil M21 is connected to the head of second secondary coil M22 or the head of first secondary coil M21 is connected to the tail of second secondary coil M22. Zone Name: A2,AMD Alternatively, the winding direction of first secondary coil M21 and the winding direction of second secondary coil M22 may be set to be the same, and the head of first secondary coil M21 may be connected to the head of second secondary coil M22 or the tail of first secondary coil M21 may be connected to the tail of second secondary coil M22 as shown in FIGS. 17(a), 17(b).

In the embodiment described above, the winding direction of primary winding M11 and the winding direction of first secondary coil M21 in the secondary winding are set to be the same. Alternatively, the winding direction of primary winding M11 and the winding direction of first secondary coil M21 in the secondary winding may be set to be opposite to each other. Although sign of the output voltage generated by signal magnetic flux $J_S$ changes when the winding direction of primary winding M11 and the winding direction of first secondary coil M21 in the secondary winding are opposite to each other, the effects of suppressing the influences of external magnetic flux $J_O$ are unchanged.

Although the coils are formed vertically in FIG. 2, an alternative configuration comprising flat coils formed by the micro-machining techniques may be used.

FIG. 5(a) is a cross sectional view schematically showing an insulating transformer according to the second embodiment of the invention.

FIG. 5(b) is a top plan view of the insulating transformer shown in FIG. 5(a).

Referring now to FIGS. 5(a) and 5(b), a lead wiring layer 12 is buried in a substrate 11 and a primary coil pattern 14 is formed on substrate 11. Primary coil pattern 14 is connected to lead wiring layer 12 via a leading port 13. A flattening film 15 is formed on primary coil pattern 14. A secondary coil pattern 17 is formed above flattening film 15 with an insulator film 16 interposed between flattening film 15 and secondary coil pattern 17. Secondary coil pattern 17 is covered with a protector film 18.

A lead wiring layer 22 is buried in a substrate 21 and a secondary coil pattern 24 is formed on substrate 21. Secondary coil pattern 24 is connected to lead wiring layer 22 via a leading port 23. Secondary coil pattern 24 is covered with a protector film 25.

Primary coil pattern 14 and secondary coil pattern 17 are wound clockwise, secondary coil pattern 24 is wound counterclockwise, and secondary coil patterns 17 and 24 are arranged in a coaxial relationship to each other. The tail of secondary coil pattern 17 is connected to the head of secondary coil pattern 24 or the head of secondary coil pattern 17 is connected to the tail of secondary coil pattern 24.

In this configuration, external magnetic flux Jo intersects secondary coil patterns 17 and 24 almost uniformly from the same direction. Signal magnetic flux $J_S$, formed by the signal current flowing through primary coil pattern 14, localizes around the axis of primary coil pattern 14 and circulates along the axis of primary coil pattern 14. Almost all the parts of signal magnetic flux $J_S$ intersect secondary coil pattern 17 arranged in a coaxial relationship above primary coil pattern 14, and a part of signal magnetic flux $J_S$ intersects secondary coil pattern 24. Due the above described configuration, the voltage level generated by signal magnetic flux $J_S$ is increased, the voltage level generated by external magnetic flux $J_O$ caused by the main circuit current is suppressed, and the S/N ratio of the signals is increased.

Moreover, the winding diameters of primary coil pattern 14 and secondary coil patterns 17 and 24 are shortened and the spacing between primary coil pattern 14 and secondary coil pattern 17 is also shortened. Therefore, the adverse effects of noise caused by external magnetic flux $J_O$ is reduced while the coupling coefficient of primary coil pattern 14 and secondary coil pattern 17 is increased and, in addition, the S/N ratio of the signals is improved.

Figure 6:
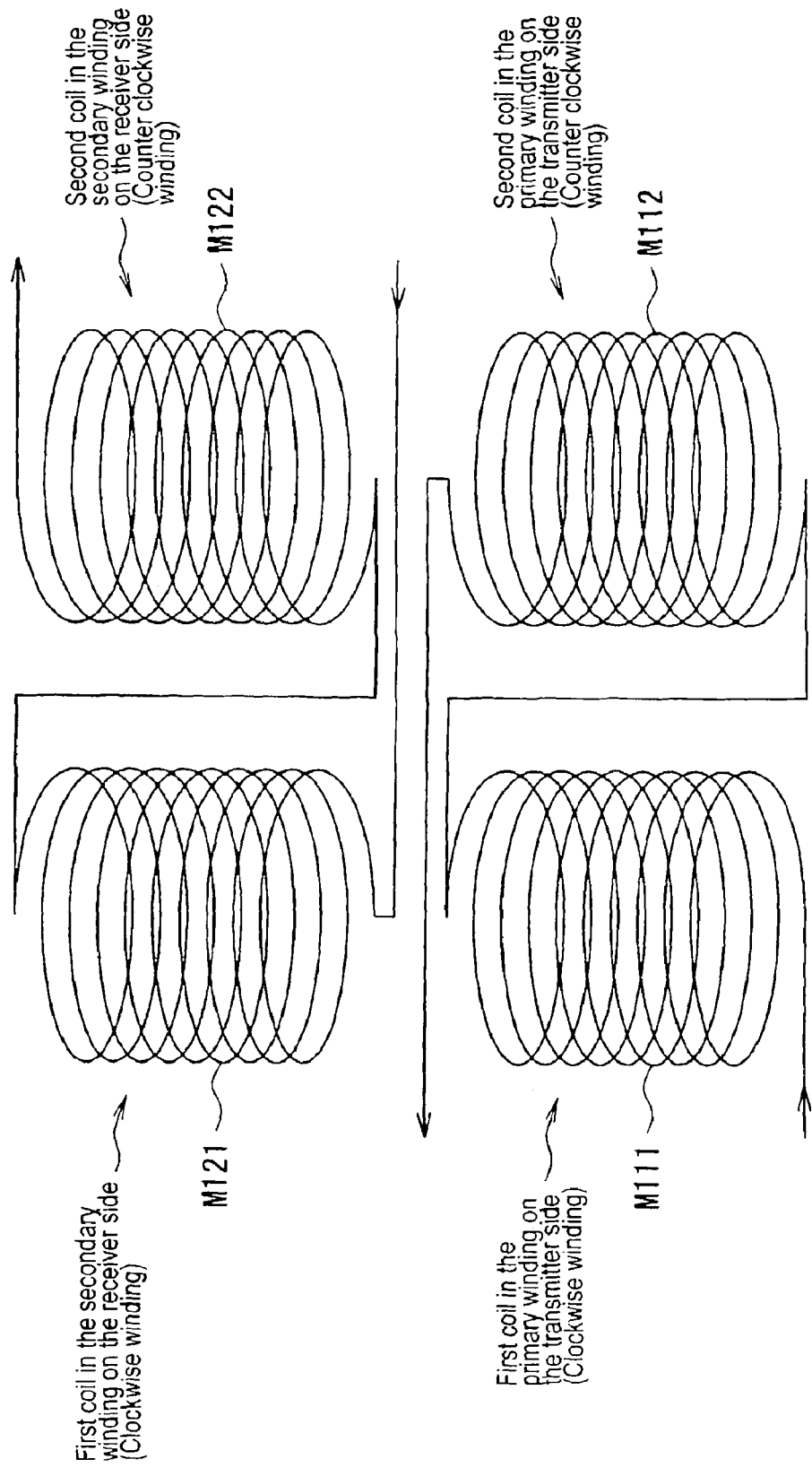
FIG. 6 schematically shows the external appearance of an air-cored insulating transformer according to a third embodiment of the invention.

FIG. 6 schematically shows the external appearance of an air-cored insulating transformer according to the third embodiment of the invention.

Referring now to FIG. 6, each of air-cored insulating transformers TU1 through TU3 and TD1 through TD3 shown in FIG. 1 includes a primary winding, working as a transmitter, and a first primary coil M111. A second primary coil M112 and a secondary winding working as a receiver include a first secondary coil M121 and a second secondary coil M122. First primary coil M111 and second primary coil M112 may be configured such that the signal magnetic flux intersecting the secondary winding is intensified. In addition, first secondary coil M121 and second secondary coil M122 may be configured such that the voltages caused by the external magnetic flux intersecting the secondary winding cancel each other and the voltage generated by the signal magnetic flux intersecting the secondary winding is intensified.

For example, the winding direction of first primary coil M111 and the winding direction of second primary coil M112 are set to be opposite to each other. In addition, first primary coil M111 and second primary coil M112 are arranged in a coaxial relationship to each other. The winding direction of first secondary coil M121 and the winding direction of second secondary coil M122 are set to be opposite to each other and furthermore, first secondary coil M121 and second secondary coil M122 are arranged in a coaxial relationship to each other. First primary coil M111 and first secondary coil M121 are also arranged in a coaxial relationship. In addition, second primary coil M112 and second secondary coil M122 are arranged in a coaxial relationship. The tail of first primary coil M111 is connected to the head of second primary coil M112. Alternatively, the head of first primary coil M111 is connected to the tail of second primary coil M112. The tail of first secondary coil M121 is connected to the head of second secondary coil M122. In still another embodiment, the head of first secondary coil M121 is connected to the tail second secondary coil M122.

As compared with the winding configuration described in FIG. 2, the winding configurations described above also facilitate making the signal magnetic flux intersect second secondary coil M122 more securely, further improving the S/N ratio.

In the winding configurations according to the third embodiment and described in FIG. 6, the winding directions of first and second primary coils M111 and M112 are set to be opposite to each other, the winding directions of first and second secondary coils M121 and M122 are set to be opposite to each other, the tail of first primary coil M111 is connected to the head of second primary coil M112 or the head of first primary coil M111 is connected to the tail of second primary coil M112, and the tail of first secondary coil M121 is connected to the head of second secondary coil M122 or, the head of first secondary coil M121 is connected to the tail second secondary coil M122.

Alternatively, the winding directions of first and second primary coils M111 and M112 are set to be the same, the winding directions of first and second secondary coils M121 and M122 are set to be the same, the head of first primary coil M111 is connected to the head of second primary coil M112 or the tail of first primary coil M111 is connected to the tail of second primary coil M112, and the head of first secondary coil M121 is connected to the head of second secondary coil M122 or the tail of first secondary coil M121 is connected to the tail second secondary coil M122 as shown in FIGS. 17(a)-17(d) with no problem.

Figure 7A:
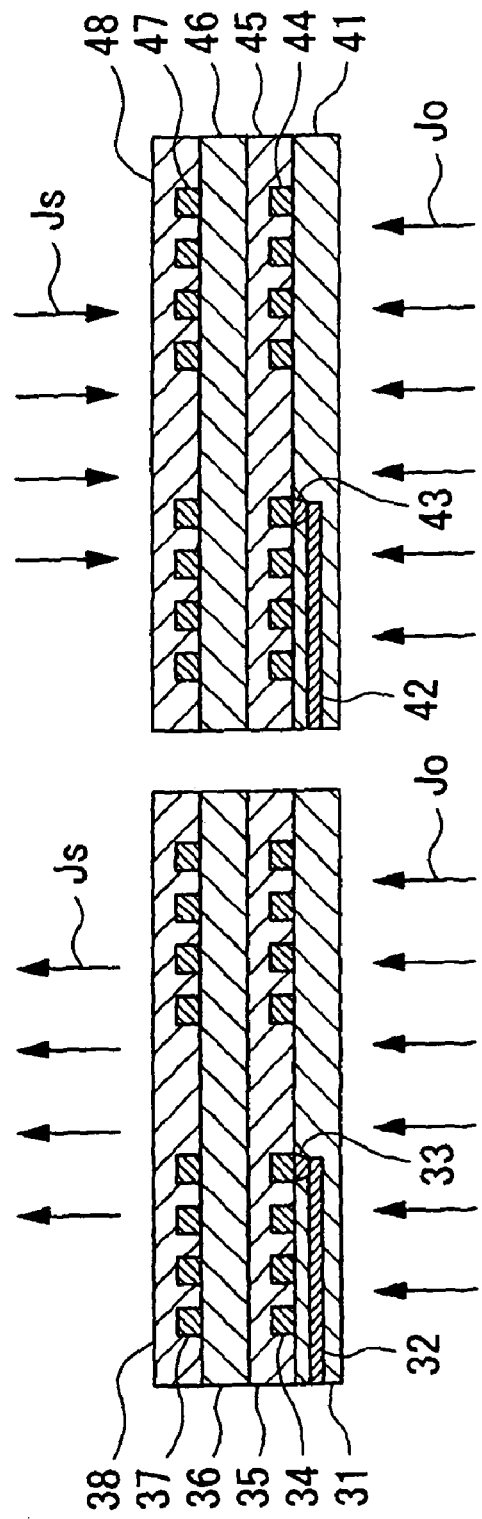
FIG. 7(a) is a cross sectional view schematically showing an insulating transformer according to a fourth embodiment of the invention.

FIG. 7(a) is a cross sectional view schematically showing an insulating transformer according to the fourth embodiment of the invention. FIG. 7(b) is a top plan view of the insulating transformer shown in FIG. 7(a).

Referring now to these drawings, a lead wiring layer 32 is buried in a substrate 31 and a primary coil pattern 34 is formed on substrate 31. Primary coil pattern 34 is connected to lead wiring layer 32 via a leading port 33. A flattening film 35 is formed on primary coil pattern 34. A secondary coil pattern 37 is formed above flattening film 35 with an insulator film 36 interposed between flattening film 35 and secondary coil pattern 37. Secondary coil pattern 37 is covered with a protector film 38.

A lead wiring layer 42 is buried in a substrate 41 and a primary coil pattern 44 is formed on substrate 41. Primary coil pattern 44 is connected to lead wiring layer 42 via a leading port 43. A flattening film 45 is formed on primary coil pattern 44. A secondary coil pattern 47 is formed above flattening film 45 with an insulator film 46 interposed between flattening film 45 and secondary coil pattern 47. Secondary coil pattern 47 is covered with a protector film 48.

Primary coil pattern 34 and secondary coil pattern 37 are wound clockwise, primary coil pattern 44 and secondary coil pattern 47 are wound counterclockwise, primary coil patterns 34 and 44 are arranged in a coaxial relationship to each other, and secondary coil patterns 37 and 47 are arranged in a coaxial relationship to each other. The tail of primary coil pattern 34 is connected to the head of primary coil pattern 44 or the head of primary coil pattern 34 is connected to the tail of primary coil pattern 44. Furthermore, the tail of secondary coil pattern 37 is connected to the head of secondary coil pattern 47 or the head of secondary coil pattern 37 is connected to the tail of secondary coil pattern 47.

In these configurations, external magnetic flux $J_O$ intersects secondary coil patterns 37 and 47 almost uniformly from the same direction. Signal magnetic flux $J_S$ formed by the signal current flowing through primary coil patterns 34 and 44 localizes around the axes of primary coil patterns 34 and 44 and circulates along the axes of primary coil patterns 34 and 44. Almost all the parts of signal magnetic flux $J_S$ intersect secondary coil patterns 37 and 47 arranged in a coaxial relationship above primary coil patterns 34 and 44. Due the above described configurations, the voltage level generated by signal magnetic flux $J_S$ is increased, the voltage level generated by external magnetic flux $J_O$ caused by the main circuit current is suppressed, and the S/N ratio of the signals is increased.

FIGS. 8(a) through 8(l) and FIGS. 9(a) through 9(h) are cross sectional views describing the manufacturing method according to the fifth embodiment of the invention for manufacturing an insulating transformer.

Figure 8A:

Referring now to FIG. 8(a), a leading diffusion 52 for leading out a primary coil pattern 55a from the center thereof is formed in a semiconductor substrate 51 by selectively implanting As, P, B and such an impurity into semiconductor substrate 51. The material for semiconductor substrate 51 is selected from Si, Ge, SiGe, SiC, SiSn, PbS, GaAs, InP, GaP, GaN, and ZnSe.

Figure 8B:
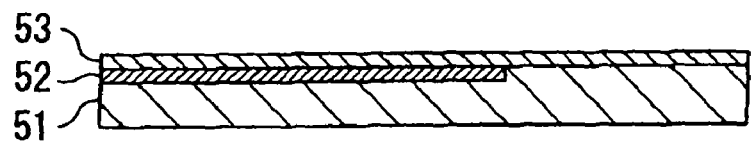

Referring now to FIG. 8(b), an insulator layer 53 is formed by plasma CVD, and other known methods, on semiconductor substrate 51, in which leading diffusion 52 is formed. For example, a silicon oxide film or a silicon nitride film may be used for insulator layer 53.

Figure 8C:
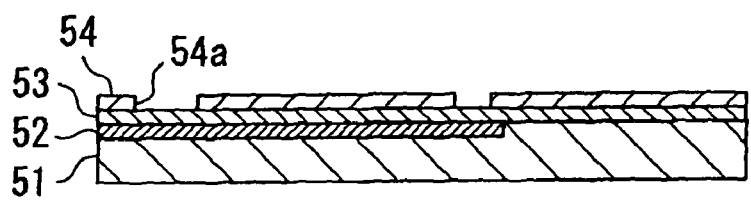

Referring now to FIG. 8(c), a resist pattern 54, in which an opening 54a is formed corresponding to the leading port for leading out primary coil pattern 55a from the center thereof, is formed on insulator layer 53 by photolithographic techniques.

Figure 8D:
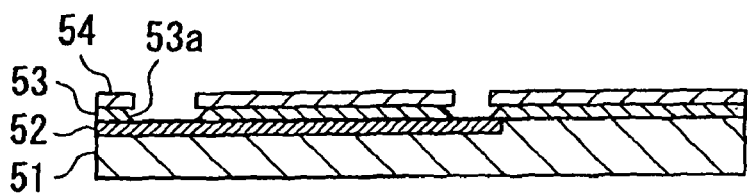

Referring now to FIG. 8(d), an opening 53a corresponding to a leading port for leading out primary coil pattern 55a from the center thereof is formed in insulator layer 53 by etching insulator layer 53 using resist pattern 54, in which opening 54a is formed as a mask.

Figure 8E:
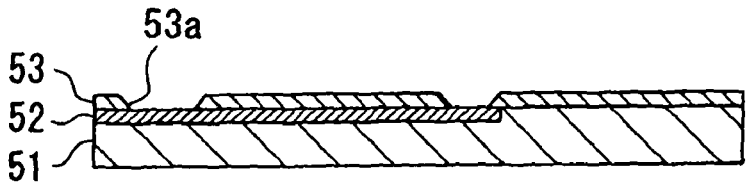

Referring now to FIG. 8(e), resist pattern 54 is pealed off insulator layer 53 with a reagent.

Figure 8F:
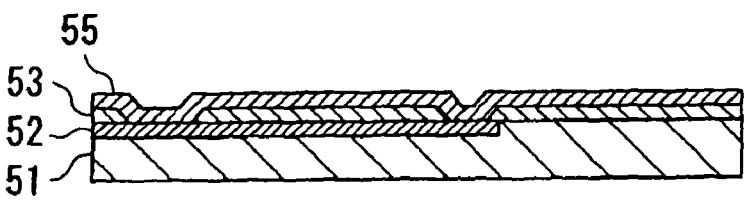

Referring now to FIG. 8(f), an electrically conductive film 55 is formed on insulator layer 53 by sputtering, vacuum deposition, and other known methods. Al, Cu, and other such metals are materials used for electrically conductive film 55.

Figure 8G:
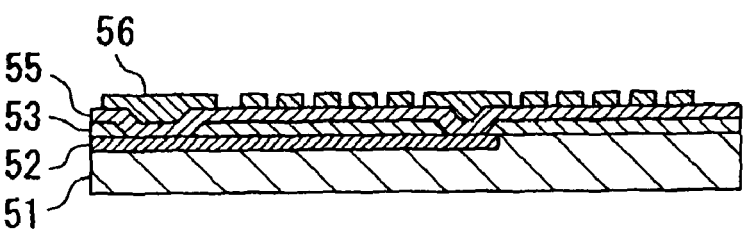

Referring now to FIG. 8(g), a resist pattern 56 corresponding to primary coil pattern 55a is formed using photolithographic techniques.

Referring now to FIG. 8(h), primary coil pattern 55a is formed on insulator layer 53 by etching electrically conductive film 55 using resist pattern 56 as a mask.

Referring now to FIG. 8(i), resist pattern 56 is pealed off primary coil pattern 55a with a reagent.

Referring now to FIG. 8(j), a flattening film 57 is formed by plasma CVD, and other known methods, on insulator layer 53, on which primary coil pattern 55a is formed. A silicon oxide film or a silicon nitride film may be used for flattening film 57.

Referring now to FIG. 8(k), flattening film 57 is flattened by oblique etching, chemical mechanical polishing (hereinafter referred to as "CMP"), and other such methods, to remove unevenness from the surface of flattening film 57.

Referring now to FIG. 8(l), a resist pattern 58 having an opening 58a formed therein corresponding to the leading port for leading out the outer end of primary coil pattern 55a is formed on flattening film 57 using photolithographic techniques.

Figure 9A:
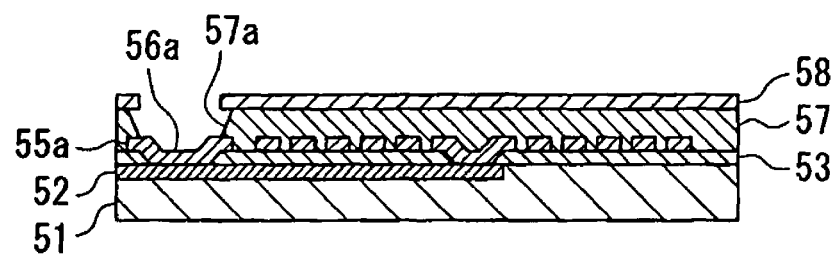
FIGS. 9(a) through 9(h) are other cross sectional views describing the other manufacturing steps for manufacturing the insulating transformer according to the fifth embodiment of the invention.

Referring now to FIG. 9(a), an opening 57a corresponding to the leading port for leading out the outer end of a secondary coil pattern 60a is formed in flattening film 57 by etching flattening film 57 using resist pattern 58 having opening 58a formed therein as a mask.

Figure 9B:
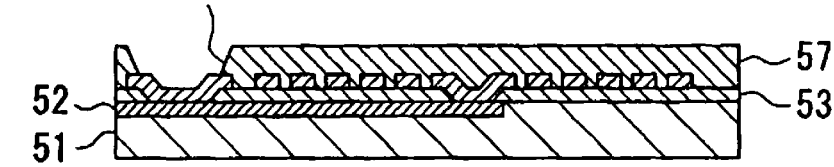

Referring now to FIG. 9(b), resist pattern 58 is pealed off flattening film 57 with a reagent.

Figure 9C:
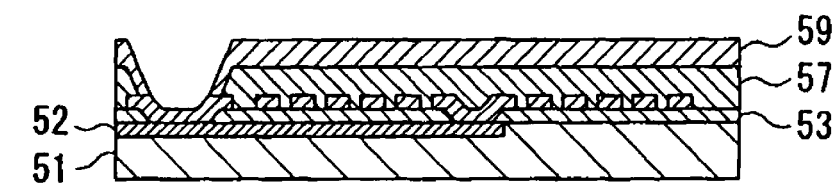

Referring now to FIG. 9(c), an isolation layer 59 for isolating primary and secondary coil patterns 55a and 60a from each other is formed on flattening film 57. For example, isolation layer 59 is formed by coating a polyimide layer on flattening film 57.

Figure 9D:
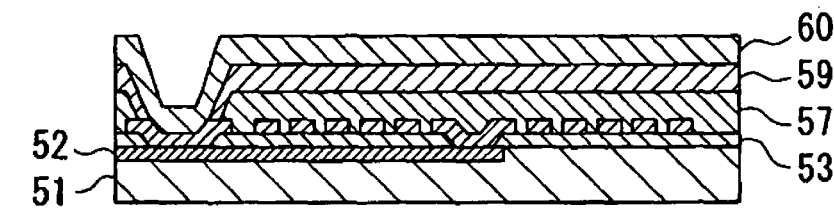

Referring now to FIG. 9(d), an electrically conductive film 60 is formed on isolation layer 59 by sputtering, vacuum deposition, and other such methods. Al, Cu, and other such metals comprise electrically conductive film 60.

Figure 9E:
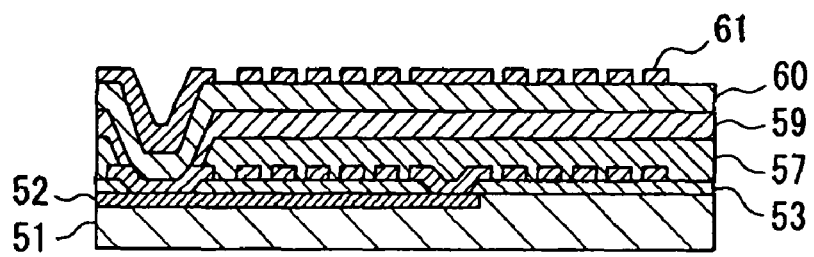

Referring now to FIG. 9(e), a resist pattern 61 corresponding to secondary coil pattern 60a is formed using photolithographic techniques.

Figure 9F:
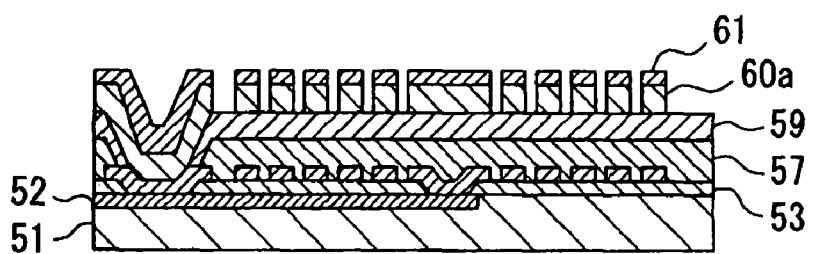

Referring now to FIG. 9(f), secondary coil pattern 60a is formed on isolation layer 59 by etching electrically conductive film 60 using resist pattern 61 as a mask.

Figure 9G:
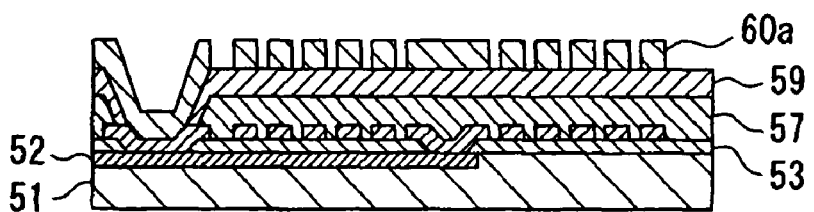

Referring now to FIG. 9(g), resist pattern 61 is pealed off secondary coil pattern 60a with a reagent.

Figure 9H:
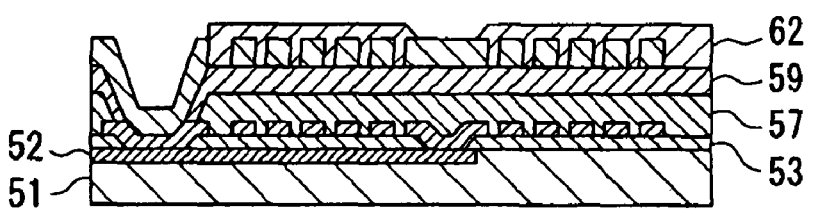

Referring now to FIG. 9(h), a protector film 62 is formed on isolation layer 59, on which secondary coil pattern 60a is formed, by plasma CVD, and other such methods. A silicon oxide film or a silicon nitride film may be used for protector film 62. The end and central sections of secondary coil pattern 60a are then exposed by patterning protector film 62 using photolithographic and other known etching techniques.

Since it is possible to laminate secondary coil pattern 60a on primary coil pattern 55a by micro-machining techniques, the winding diameters of primary and secondary coil patterns 55a and 60a are shortened and the spacing between primary and secondary coil patterns 55a and 60a is also shortened.

Figure 10:
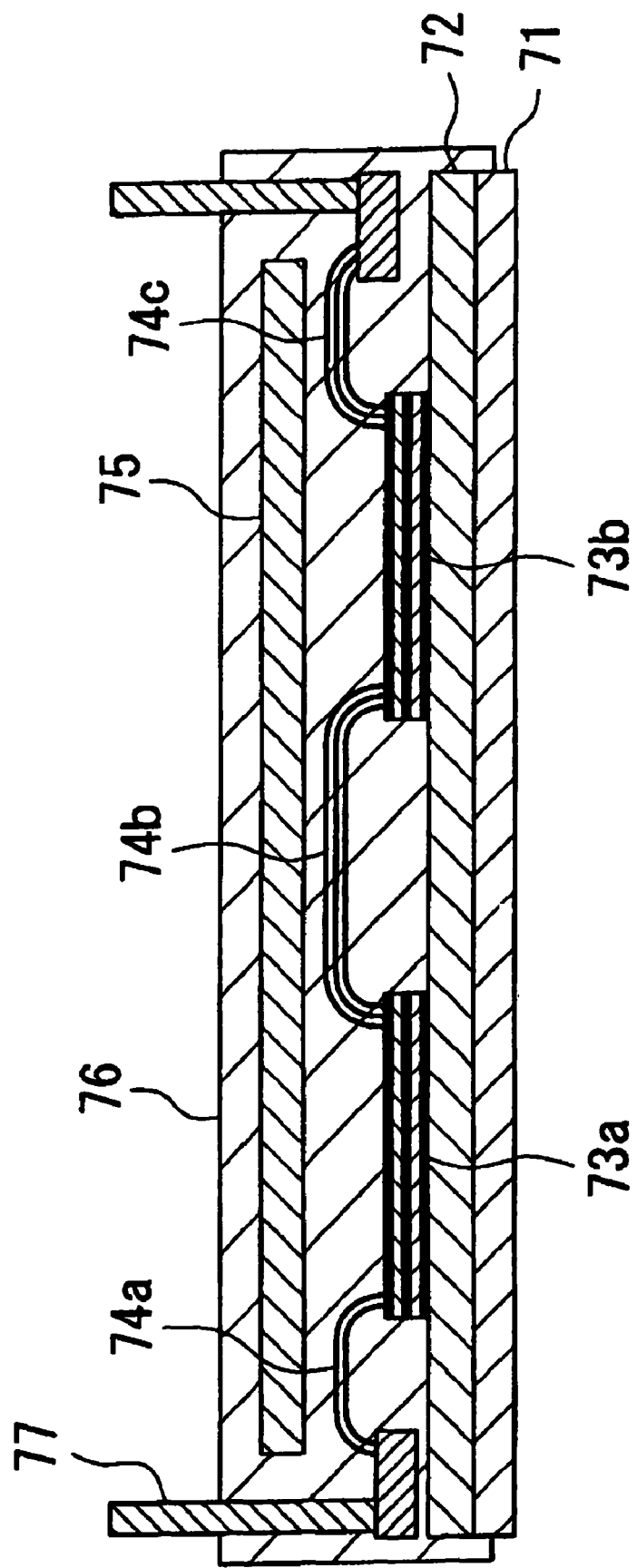
FIG. 10 is a cross sectional view showing the mounted state of an intelligent power module for the step-up and step-down converter according to a sixth embodiment of the invention.
Figure 11:
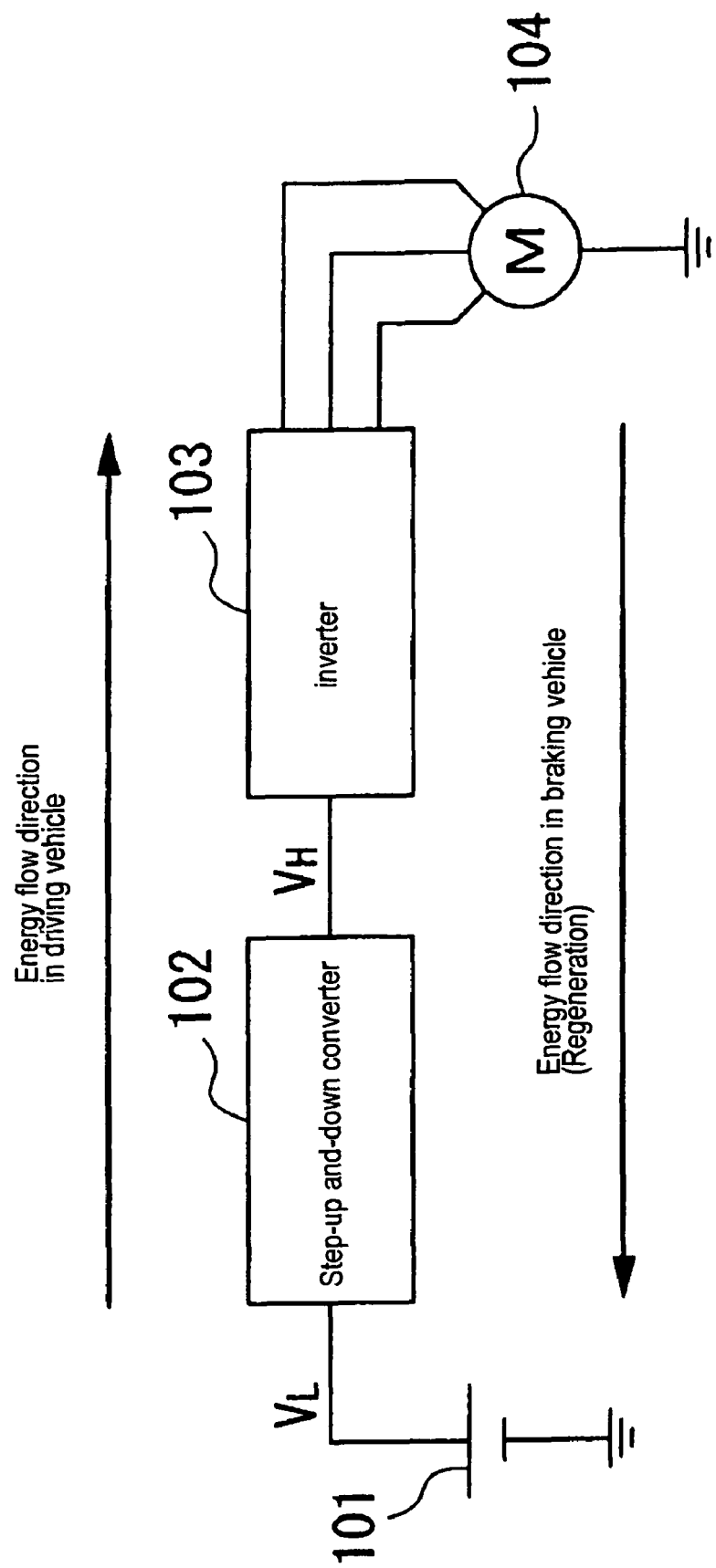
FIG. 11 is a block diagram schematically showing a vehicle driving system that employs a conventional step-up and step-down converter.
Figure 12:
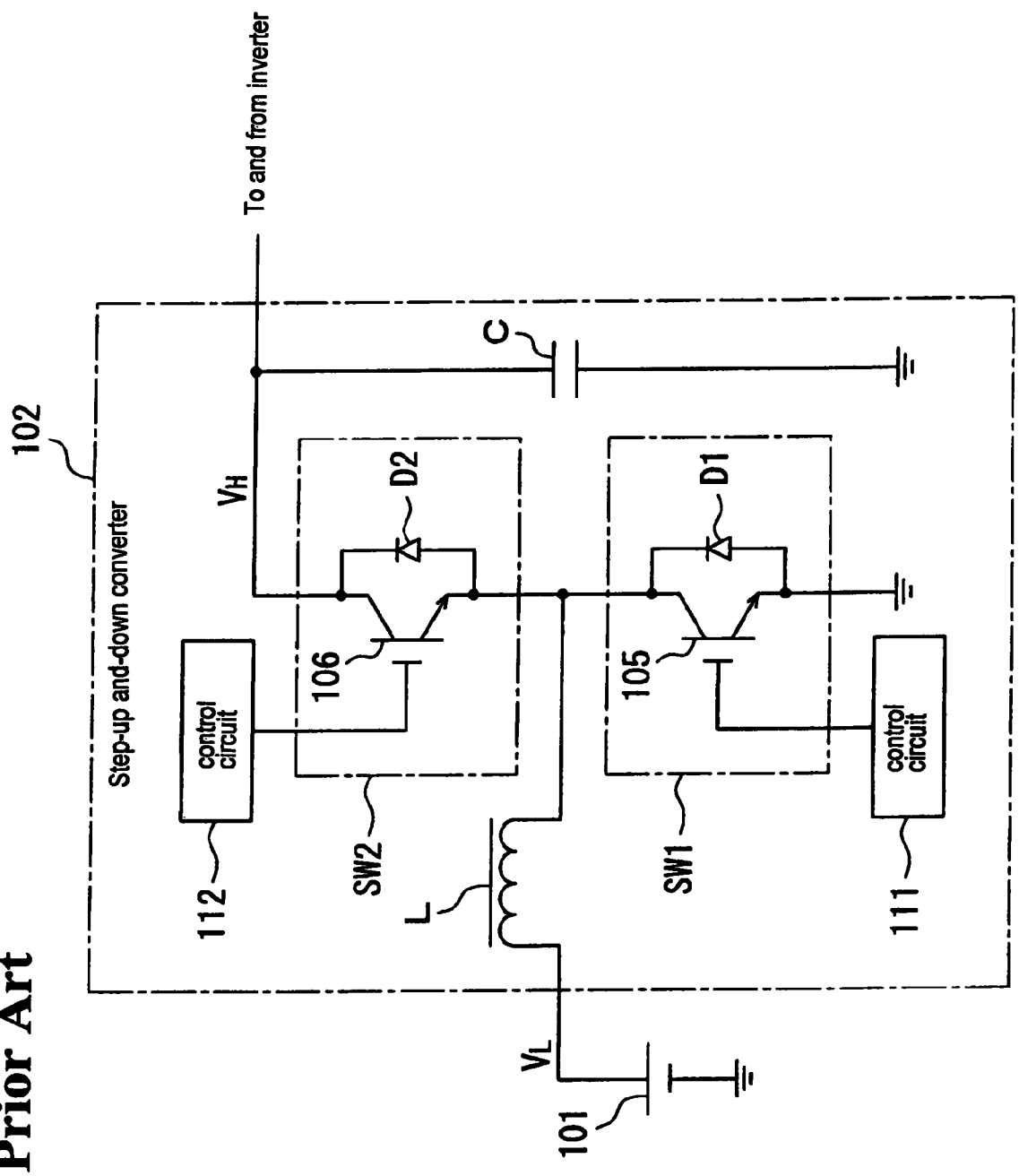
FIG. 12 is a block circuit diagram of the step-up and step-down converter shown in FIG. 11.
Figure 13:
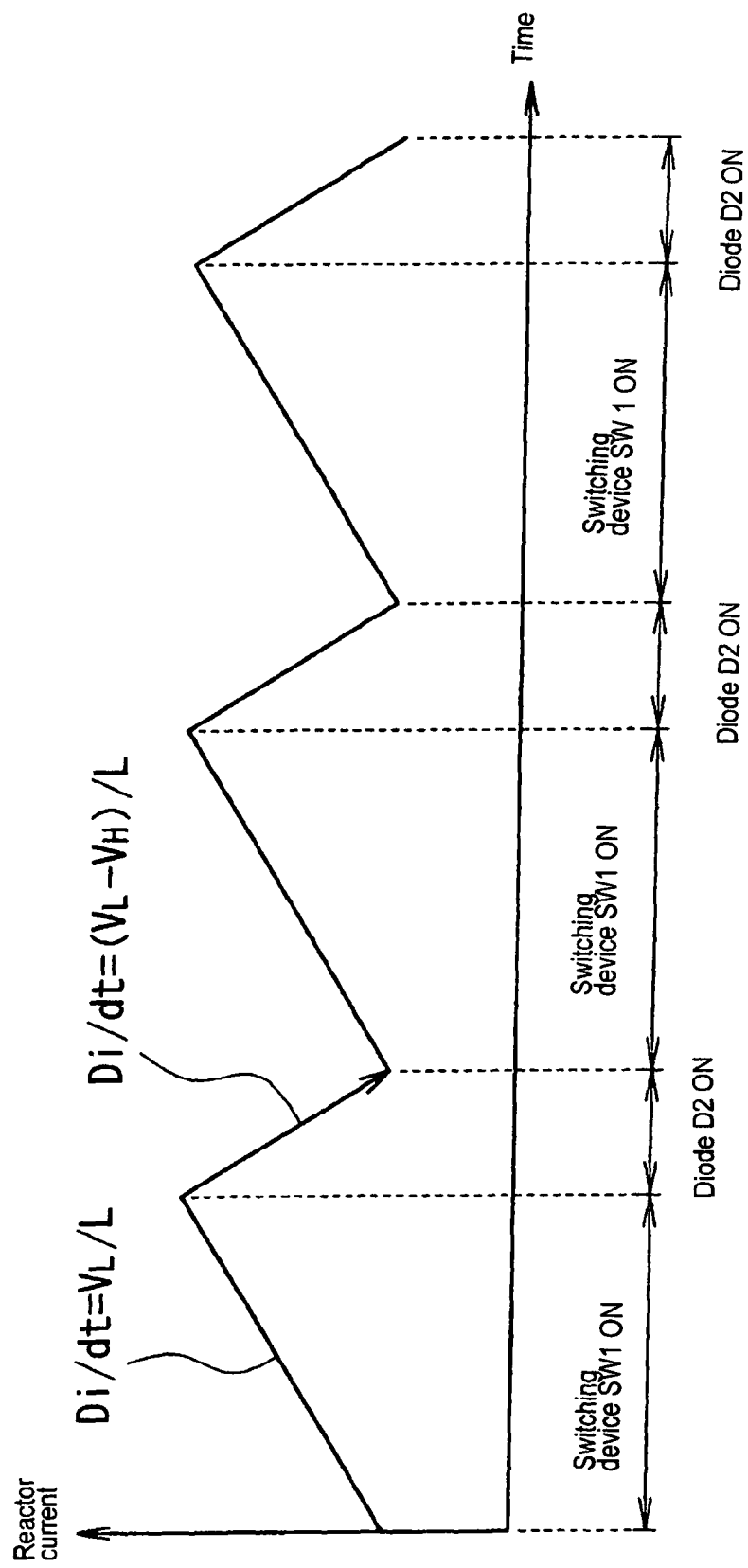
FIG. 13 is a wave chart describing the waveform of the current flowing through the reactor shown in FIG. 12 in the boosting operation.
Figure 14:
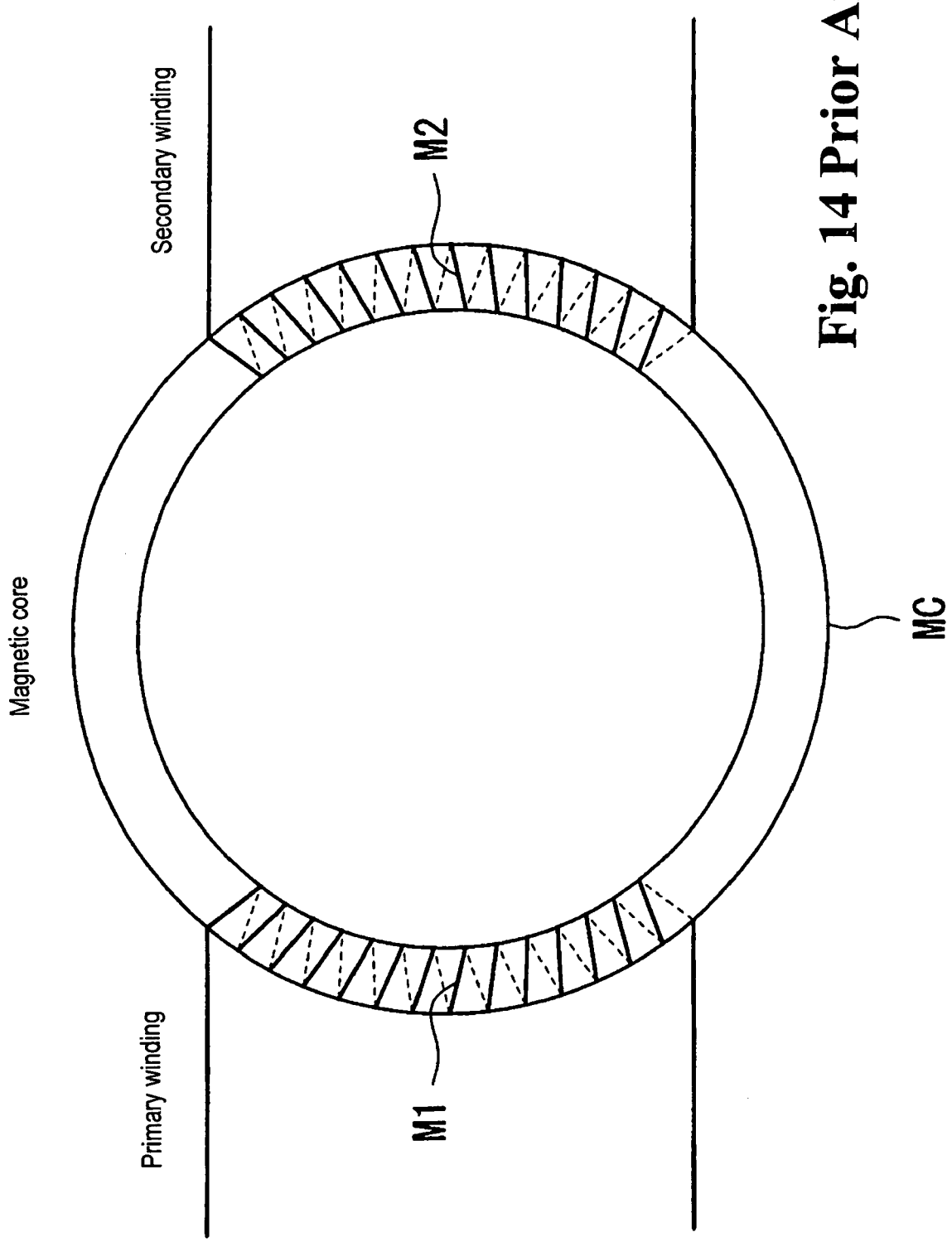
FIG. 14 is a top plan view schematically showing a conventional insulating transformer for signal transmission.
Figure 15:
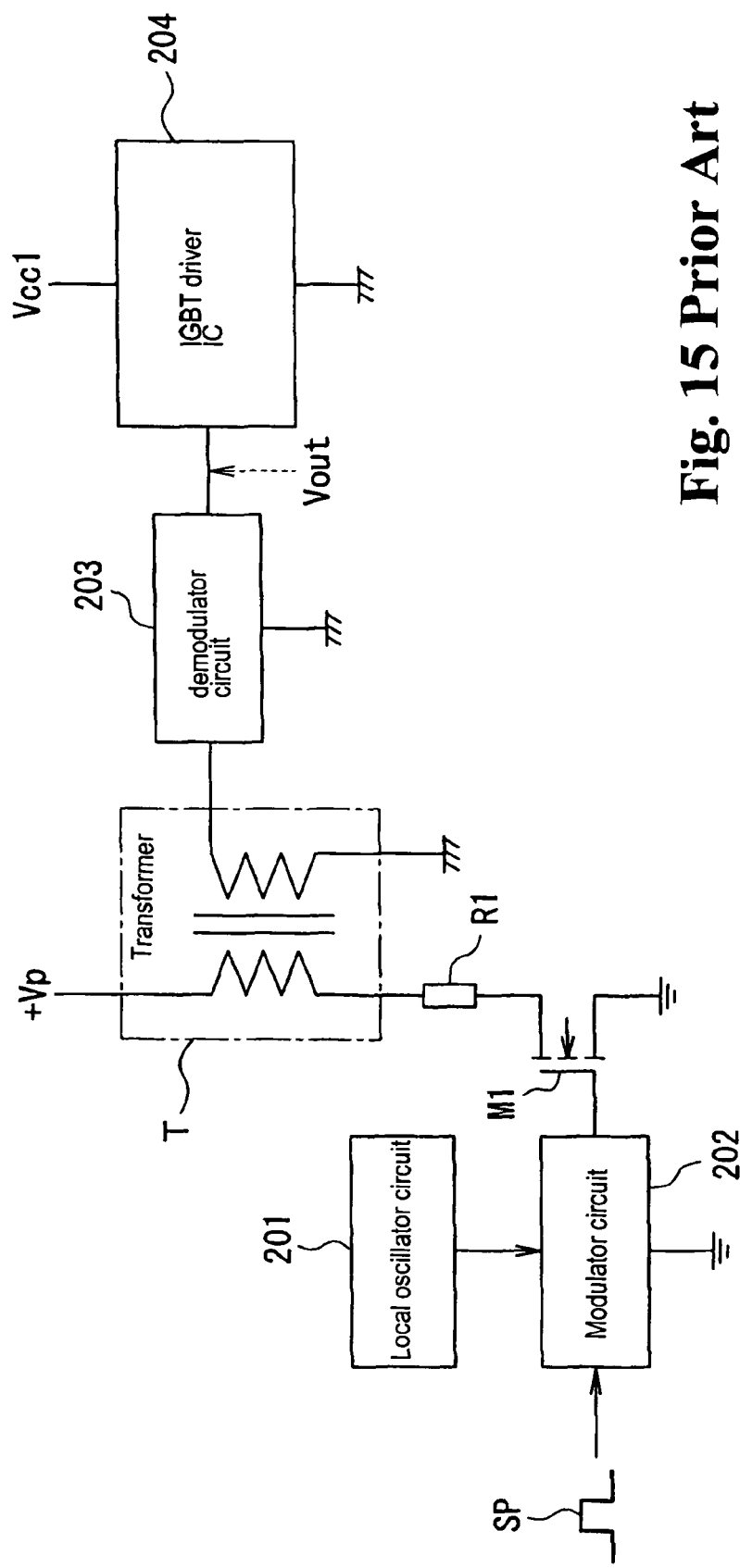
FIG. 15 is a block diagram of a signal transmission circuit using a conventional insulating transformer for signal transmission.
Figure 16A:
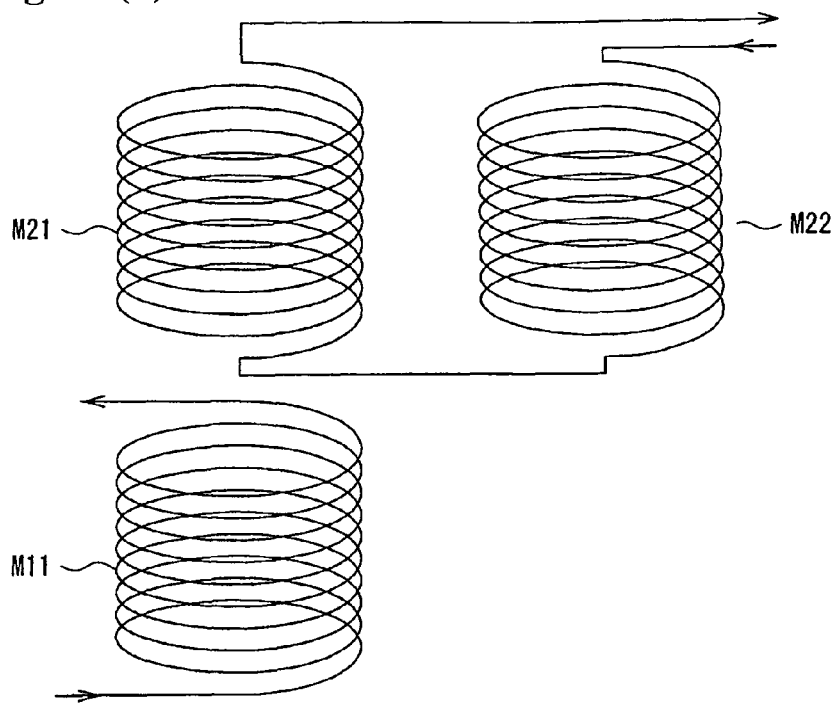
FIG. 16 schematically shows the external appearance of an air-cored insulating transformer in which a winding direction of the first secondary coil is the same as a winding direction of the second secondary coil.
Figure 16B:
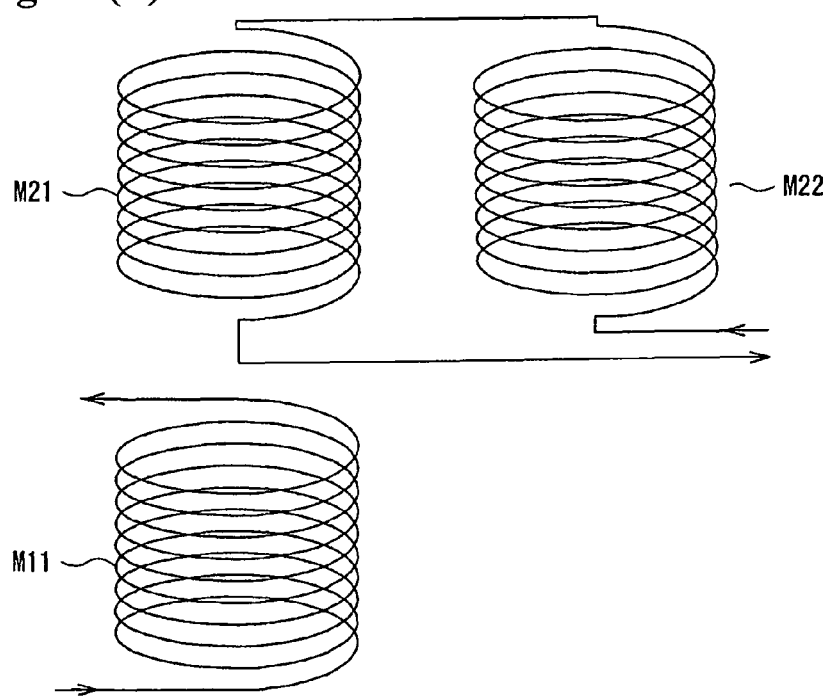

FIG. 10 is a cross sectional view showing the mounted state of an IPM for the step-up and step-down converter according to the sixth embodiment of the invention.

Referring now to FIG. 10, an IGBT chip 73a and an FWD chip 73b are mounted on a copper base board 71 for heat dissipation via a ceramics substrate 72 for insulation. IGBT chip 73a and FWD chip 73b are connected to each other and to a main terminal 77 for removing the main circuit current via bonding wires 74a through 74c. A circuit board 75 for driving the IGBT's gate and for monitoring the IGBT is arranged above IGBT chip 73a and FWD chip 73b.

IGBT chip 73a, FWD chip 73b, and circuit board 75 are sealed with a mold resin 76. IGBT chip 73a and FWD chip 73b constitute switching devices, which direct a current flow to the load and interrupt the current flowing to the load, such that the switching devices for the upper and lower arms are connected in series to each other. A control circuit that generates control signals for directing the conduction and non-conduction of the switching devices is disposed on circuit board 75.

Although the main circuit current flows not only to main terminal 77 but also through bonding wires 74a through 74c connecting main terminal 77 with IGBT chip 73a and FWD chip 73b, the magnetic field generated by the main circuit current flowing through bonding wires 74a through 74c is very influential because bonding wires 74a through 74c are arranged in close proximity to circuit board 75. In normal driving, the main circuit current is approximately 250 A, at most. Sometimes, for example, at the time of starting or under the load after slipping, a main circuit current of 900 A, or higher flows.

Air-cored insulating transformers are inserted between the control circuit grounded to the vehicle body and the upper and lower arms, which are biased at a high voltage. The control circuit transmits and receives signals to and from the upper and lower arms using the air-cored insulating transformers while the control circuit is insulated electrically from the upper and lower arms by the air-cored insulating transformers. The secondary winding in each of the air-cored insulating transformers includes a plurality of coils configured such that the voltages caused by the external magnetic flux intersecting the secondary winding are canceled and voltage generated by the signal magnetic flux is increased.

The configurations described above makes it possible to set the signal level of the output voltage from the secondary winding, that is the receiver side of the air-cored insulating transformer, to be much higher than the noise level generated by a main circuit current flowing through bonding wires 74a through 74c connecting IGBT chip 73a, FWD chip 73b, and main terminal 77, even when the main circuit current is high. Therefore, it is possible to deliver signals without causing any malfunction even when air-cored insulating transformers are used.

The disclosure of Japanese Patent Application No. 2006-073165 filed on Mar. 16, 2006 is incorporated as a reference in its entirety.

While the invention has been explained with reference to the specific embodiments of the invention, the explanation is illustrative and the invention is limited only by the appended claims.

What is claimed is:

1. A power electronics equipment comprising:
   a switching device for making a current flow to a load or interrupting the current flowing to the load, said switching device having control terminals;
   a control circuit generating a control signal directing conduction and non-conduction of the switching device;
   a driver circuit for driving the control terminals of the switching device based on the control signal; and
   at least one air-cored insulating transformer insulating the control circuit from the driver circuit, each transformer comprising a primary winding generating a magnetic field and a secondary winding on a receiver side generating a voltage by a change of interlinkage of the magnetic field;

wherein when the control circuit transmits the control signal to the switching device, the current flows through the primary winding of the transformer to create a signal magnetic flux, the secondary winding comprises a first secondary coil and a second secondary coil arranged adjacent to each other configured such that voltages generated by external magnetic flux intersecting the secondary winding are canceled and a voltage generated by the signal magnetic flux intersecting the secondary winding is increased, a winding direction of the first secondary coil is the same as a winding direction of the second secondary coil, the primary winding and the first secondary coil are arranged in a coaxial relationship, and the first secondary coil and the second secondary coil each comprises a head and a tail in which the head of the first secondary coil is connected to the head of the second secondary coil or the tail of the first secondary coil is connected to the tail of the second secondary coil.

2. The power electronics equipment according to claim 1, wherein a number of turns of the first secondary coil is substantially equal to a number of turns of the second secondary coil.

3. The power electronics equipment according to claim 1, wherein the air-cored insulating transformer is a micro-machined air-cored insulating transformer.

4. A power electronics equipment comprising:

a switching device configured to direct a current flowing to a load and to interrupt the current flowing to the load, said switching device having a control terminal;

a control circuit configured to generate a control signal directing conduction and non- conduction of the switching devices;

a driver circuit for driving the control terminal of the switching device based on the control signal; and at least one air-cored insulating transformer insulating the control circuit from the driver circuit, said insulating transformer comprising a primary winding on a transmitter side and a secondary winding on a receiver side;

wherein when the control circuit transmits the control signal to the switching device, the current flows through the primary winding of the transformer to create a signal magnetic flux, the primary winding comprises a first primary coil and a second primary coil arranged adjacent to each other configured such that a voltage generated by the signal magnetic flux intersecting the secondary winding is increased; and wherein the secondary winding comprises a first secondary coil and a second secondary coil arranged adjacently to each other configured such that the voltages caused by external magnetic flux intersecting the secondary winding are canceled and a voltage generated by the signal magnetic flux intersecting the secondary winding is increased, the first primary coil and the first secondary coil are arranged in a coaxial relationship, the second primary coil and the second secondary coil are arranged in a coaxial relationship, a winding direction of the first primary coil is the same as a winding direction of the second primary coil, the first primary coil and the second primary coil each comprises a head and a tail in which the head of the first primary coil is connected to the head of the second primary coil, or the tail of the first primary coil is connected to the tail of the second primary coil, a winding direction of the first secondary coil is the same as a winding direction of the second secondary coil, and the first secondary coil and the second secondary coil each comprises a head and a tail in which the head of the first secondary coil is connected to the head of the second secondary coil, or the tail of the first secondary coil is connected to the tail of the second secondary coil.

\* \* \* \* \*

UNITED STATES PATENT AND TRADEMARK OFFICE
CERTIFICATE OF CORRECTION

PATENT NO. : 8,288,894 B2
APPLICATION NO. : 11/703801
DATED : October 16, 2012
INVENTOR(S) : Hiroyuki Yoshimura It is certified that error appears in the above-identified patent and that said Letters Patent is hereby corrected as shown below:

In the Specification

Column 11, line 11, "flux direction (B)" should read --flux direction (B).--.

Column 11, line 13, "Jo" should read --$J_O$--.

Column 11, line 48, please delete "Zone Name: A2, AMD.".

Column 12, line 31, "Jo" should read --$J_O$--.

In the Claims

Column 18, line 10, please delete "and".

Signed and Sealed this
Eighteenth Day of June, 2013

Teresa Stanek Rea
*Acting Director of the United States Patent and Trademark Office*